(12) United States Patent
Shibue

(10) Patent No.: US 11,605,662 B2
(45) Date of Patent: Mar. 14, 2023

(54) IMAGING ELEMENT, IMAGING DEVICE, ELECTRONIC DEVICE, AND METHOD OF MANUFACTURING IMAGING ELEMENT

(71) Applicant: SONY SEMICONDUCTOR SOLUTIONS CORPORATION, Kanagawa (JP)

(72) Inventor: Hitoshi Shibue, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/758,394

(22) PCT Filed: Oct. 9, 2018

(86) PCT No.: PCT/JP2018/037546
§ 371 (c)(1),
(2) Date: Apr. 22, 2020

(87) PCT Pub. No.: WO2019/087700
PCT Pub. Date: May 9, 2019

(65) Prior Publication Data
US 2020/0343290 A1    Oct. 29, 2020

(30) Foreign Application Priority Data
Jan. 11, 2017   (JP) ............... JP2017-212206

(51) Int. Cl.
*H01L 27/146*   (2006.01)
*H01L 23/28*    (2006.01)
*H01L 21/56*    (2006.01)

(52) U.S. Cl.
CPC ...... *H01L 27/14632* (2013.01); *H01L 21/563* (2013.01); *H01L 23/28* (2013.01);
(Continued)

(58) Field of Classification Search
CPC ............. H01L 21/563; H01L 23/3178; H01L 2224/09179; H01L 2224/06179;
(Continued)

(56) References Cited

U.S. PATENT DOCUMENTS 6,049,124 A * 4/2000 Raiser ................ H01L 29/0657
                                                    257/E29.022
6,214,650 B1 * 4/2001 Nagerl .................. H05K 3/284
                                                    257/E21.511
(Continued)

FOREIGN PATENT DOCUMENTS

CN    104364894 A    2/2015
CN    104364898 A    2/2015
(Continued)

OTHER PUBLICATIONS

International Search Report and Written Opinion of PCT Application No. PCT/JP2018/037546, dated Dec. 11, 2018, 11 pages of ISRWO.

(Continued)

*Primary Examiner* — David A Zarneke
(74) *Attorney, Agent, or Firm* — Chip Law Group

(57) ABSTRACT

An imaging element according to the present disclosure is an imaging element flip-chip mounted on a wiring substrate, in which a projection is provided on a side surface of the imaging element such that a bottom surface side of the imaging element projects from a top surface side. Then, in the imaging device according to the present disclosure, the imaging device is flip-chip mounted on the wiring substrate so that a top surface of the imaging element faces the wiring substrate, and an outer periphery of the imaging element on the wiring substrate is sealed with a sealing material. An adhesion site of the sealing material is urged to a side of the (Continued)

projection, so that penetration of a solute and a solvent forming the sealing material may be reduced.

10 Claims, 24 Drawing Sheets

(52) U.S. Cl.
CPC .. *H01L 27/14636* (2013.01); *H01L 27/14643* (2013.01); *H01L 27/14685* (2013.01); *H01L 27/14687* (2013.01); *H01L 2924/10156* (2013.01)

(58) Field of Classification Search
CPC . H01L 2224/09103; H01L 2224/09517; H01L 2924/10156; H01L 2924/0657
See application file for complete search history.

(56) References Cited

U.S. PATENT DOCUMENTS

| | | | | |
|---|---|---|---|---|
| 7,682,879 B2* | 3/2010 | Echols | ............... | H01L 21/563 257/788 |
| 7,691,726 B2* | 4/2010 | Seng | ............... | H01L 29/0657 257/730 |
| 7,838,424 B2* | 11/2010 | Karta | ............... | H01L 23/3185 438/114 |
| 8,347,493 B2* | 1/2013 | Taniguchi | ............... | H05K 1/187 29/841 |
| 8,350,383 B2* | 1/2013 | Daubenspeck | ..... | H01L 23/3128 257/730 |
| 8,492,199 B2* | 7/2013 | Coffin | ............... | H01L 24/32 438/118 |
| 9,064,881 B2* | 6/2015 | Tsai | ............... | H01L 24/81 |
| 9,331,047 B2* | 5/2016 | Ohashi | ............... | H05K 3/305 |
| 9,508,623 B2* | 11/2016 | Suthiwongsunthorn | ............... | H01L 21/568 |
| 2003/0111720 A1* | 6/2003 | Tan | ............... | H01L 24/32 257/E29.022 |
| 2004/0232530 A1* | 11/2004 | Morganelli | ............ | H05K 3/305 257/E21.503 |
| 2004/0238925 A1* | 12/2004 | Morganelli | ........... | H01L 21/563 257/E21.503 |
| 2010/0187672 A1* | 7/2010 | Yamamoto | ............. | H05K 3/305 257/E23.18 |
| 2013/0119533 A1 | 5/2013 | Chen et al. | | |
| 2014/0322866 A1* | 10/2014 | Chen | ............... | H01L 24/97 438/108 |
| 2015/0085094 A1 | 3/2015 | Fujimori et al. | | |
| 2015/0087086 A1 | 3/2015 | Yoshida et al. | | |
| 2015/0333037 A1 | 11/2015 | Yoshida et al. | | |
| 2016/0074583 A1* | 3/2016 | Hyde | ............... | G16H 50/50 600/27 |
| 2017/0186719 A1* | 6/2017 | Kira | ............... | H01L 21/563 |

FOREIGN PATENT DOCUMENTS

| | | |
|---|---|---|
| CN | 104364898 A1 | 2/2015 |
| EP | 2858105 A1 | 4/2015 |
| EP | 2858106 A1 | 4/2015 |
| JP | 05-055278 A | 3/1993 |
| JP | 2001-250843 A | 9/2001 |
| JP | 2010-087081 A | 4/2010 |
| JP | 2011-018766 A | 1/2011 |
| JP | 6147250 B2 | 6/2017 |
| JP | 2017-135397 A | 8/2017 |
| JP | 6315859 B2 | 4/2018 |
| WO | 2012/133760 A1 | 10/2012 |
| WO | 2013/179766 A1 | 12/2013 |
| WO | 2013/179767 A1 | 12/2013 |

OTHER PUBLICATIONS

Supplementary European Search Report of EP Application No. 18873433.9, dated Mar. 18, 2021, 11 pages.
Office Action for EP Patent Application No. 18873433.9, dated Dec. 5, 2022, 10 pages of Office Action.

* cited by examiner

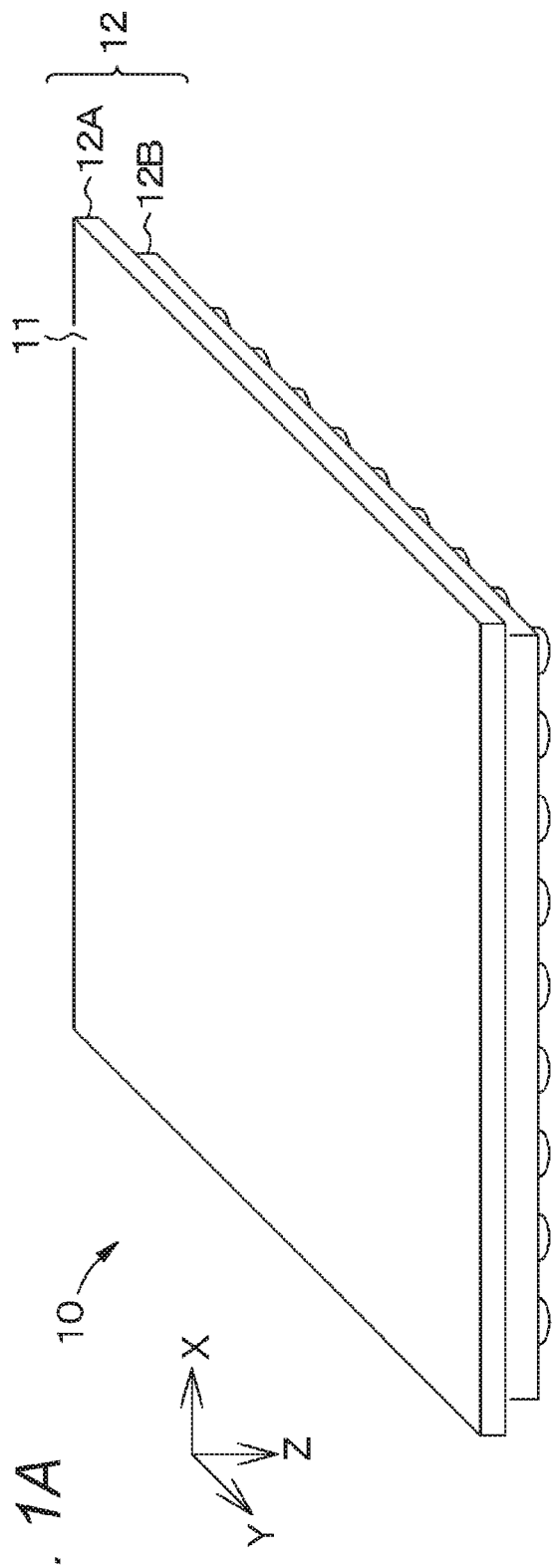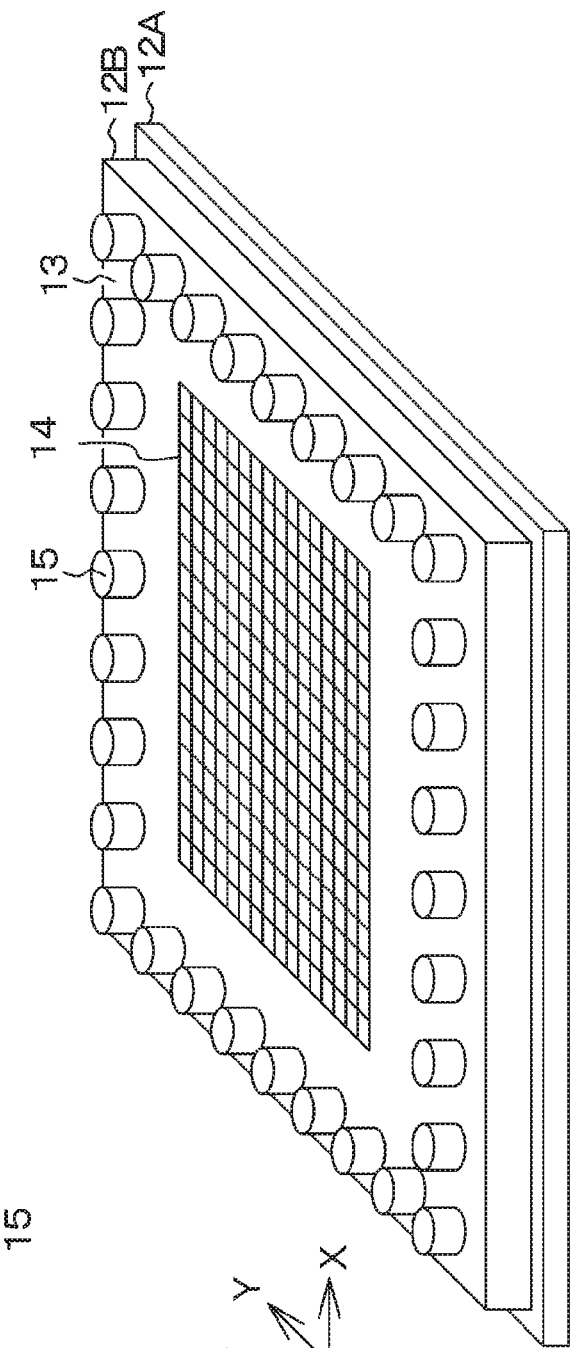

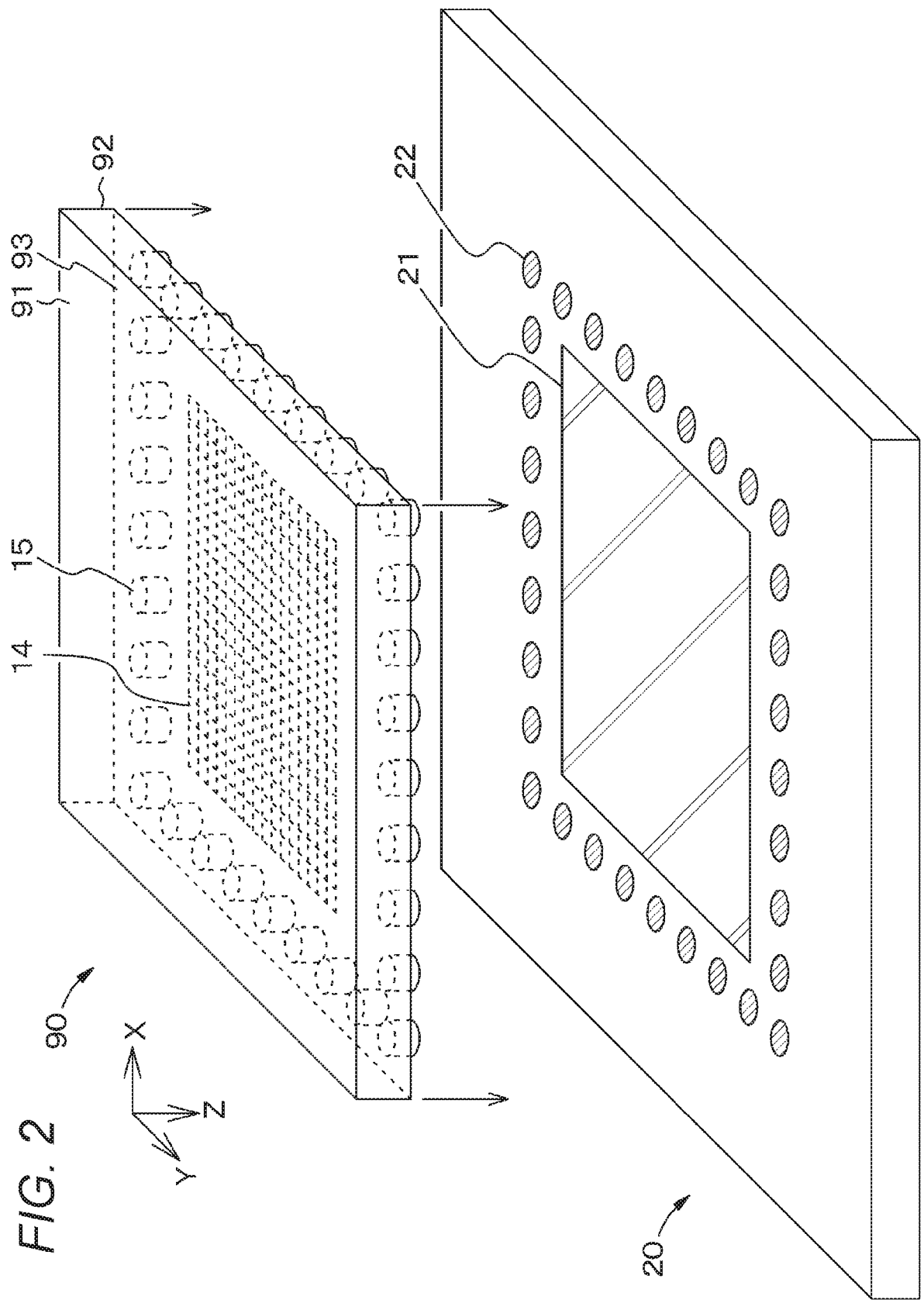

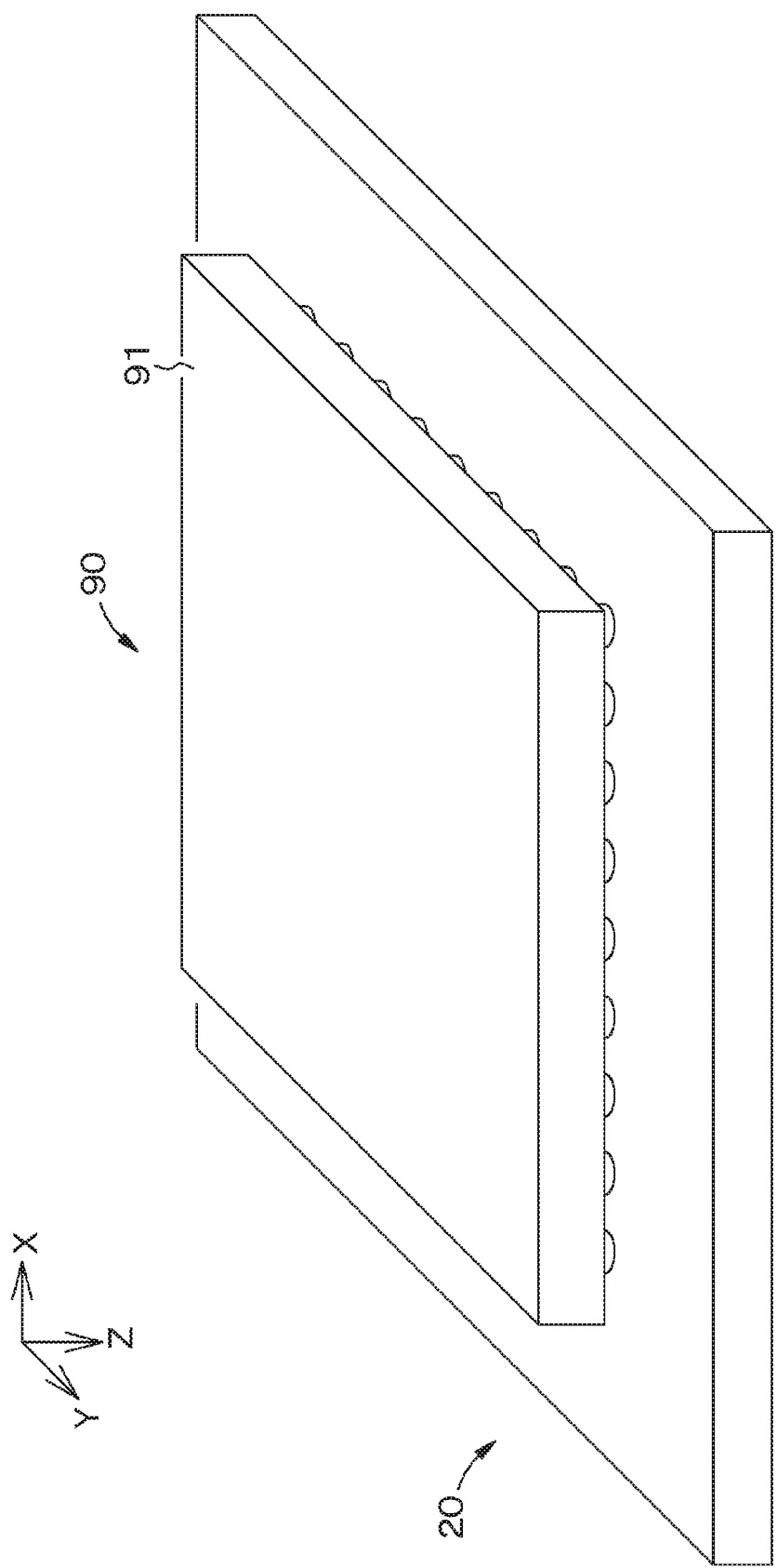

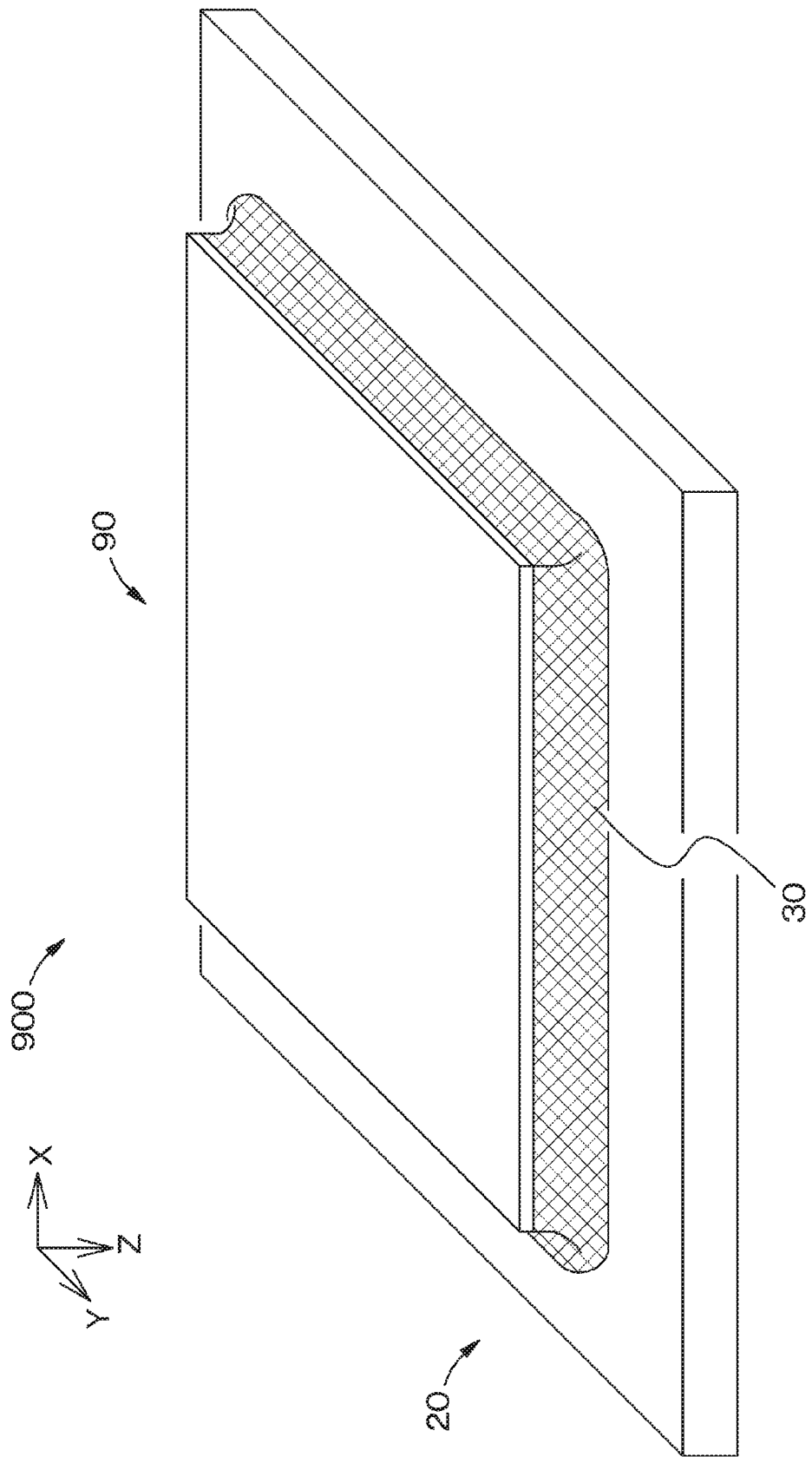

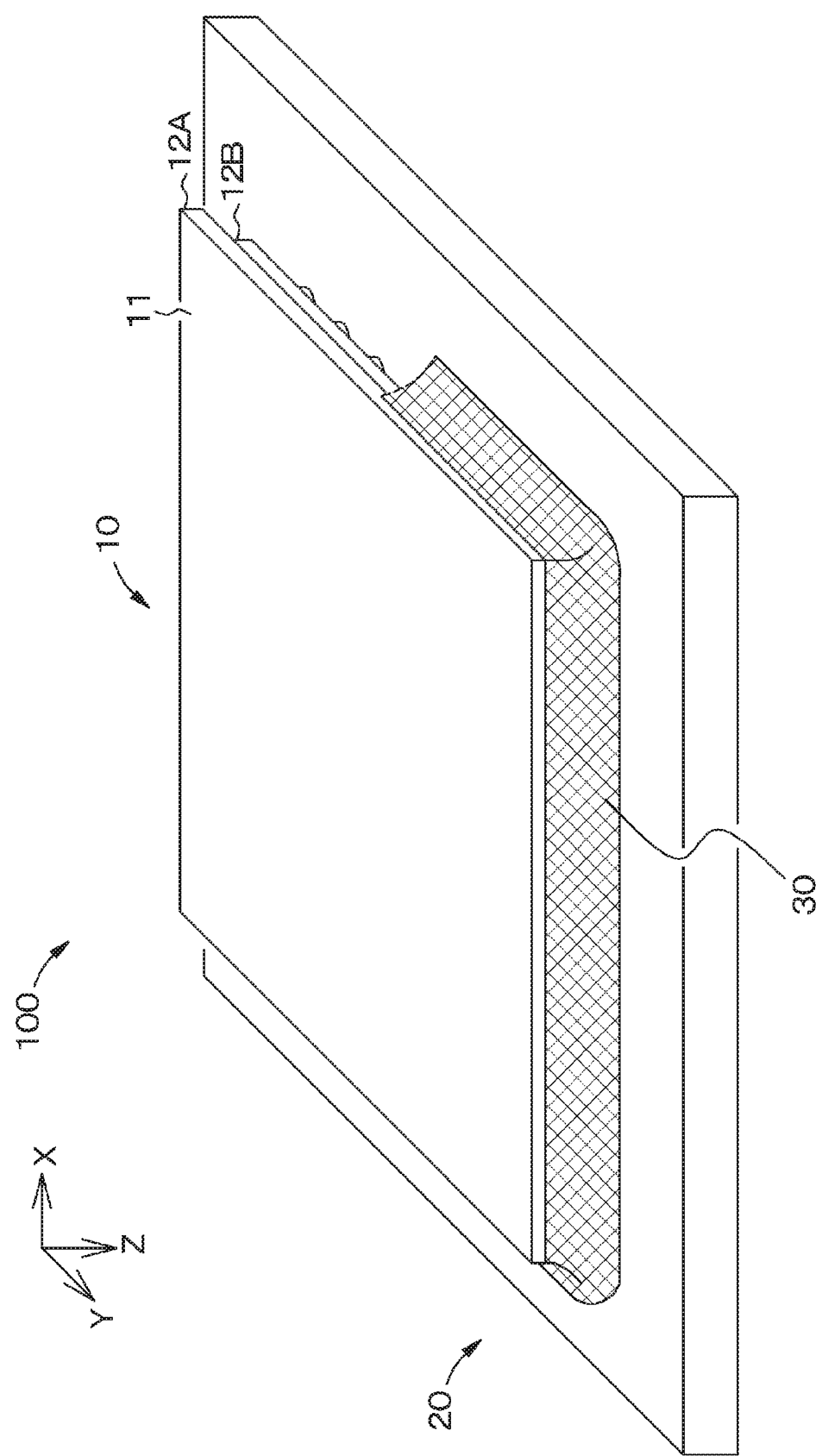

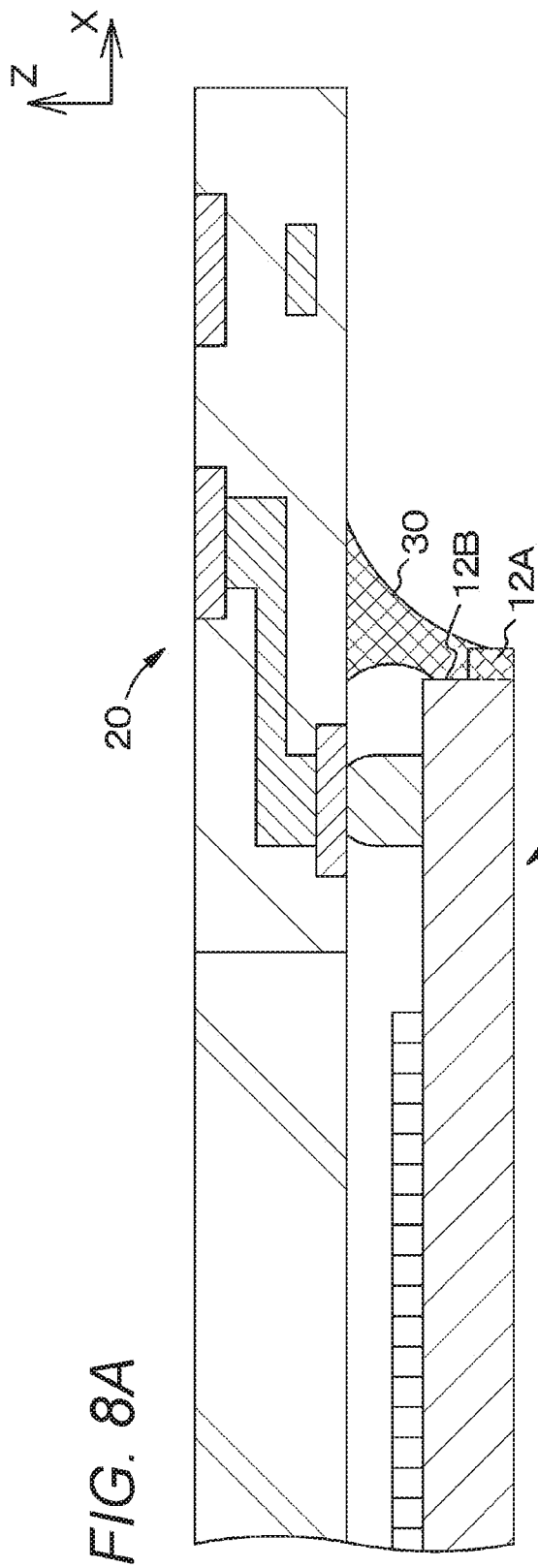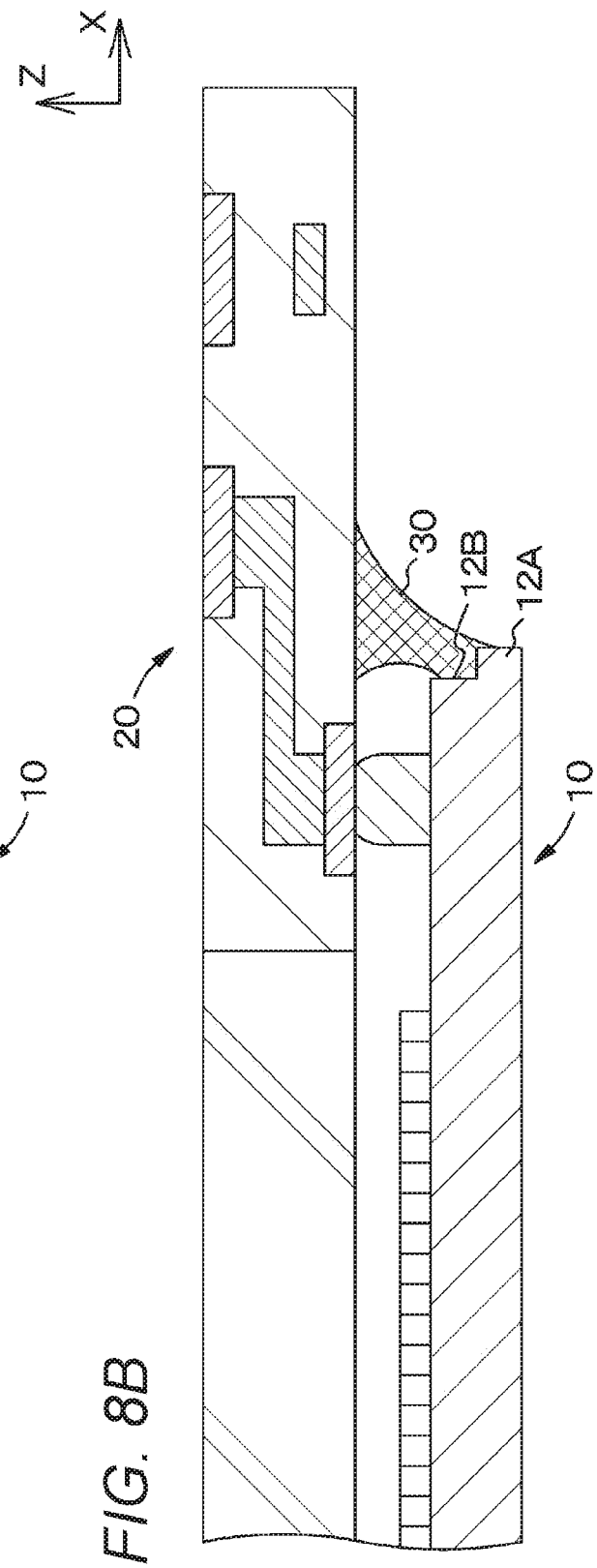

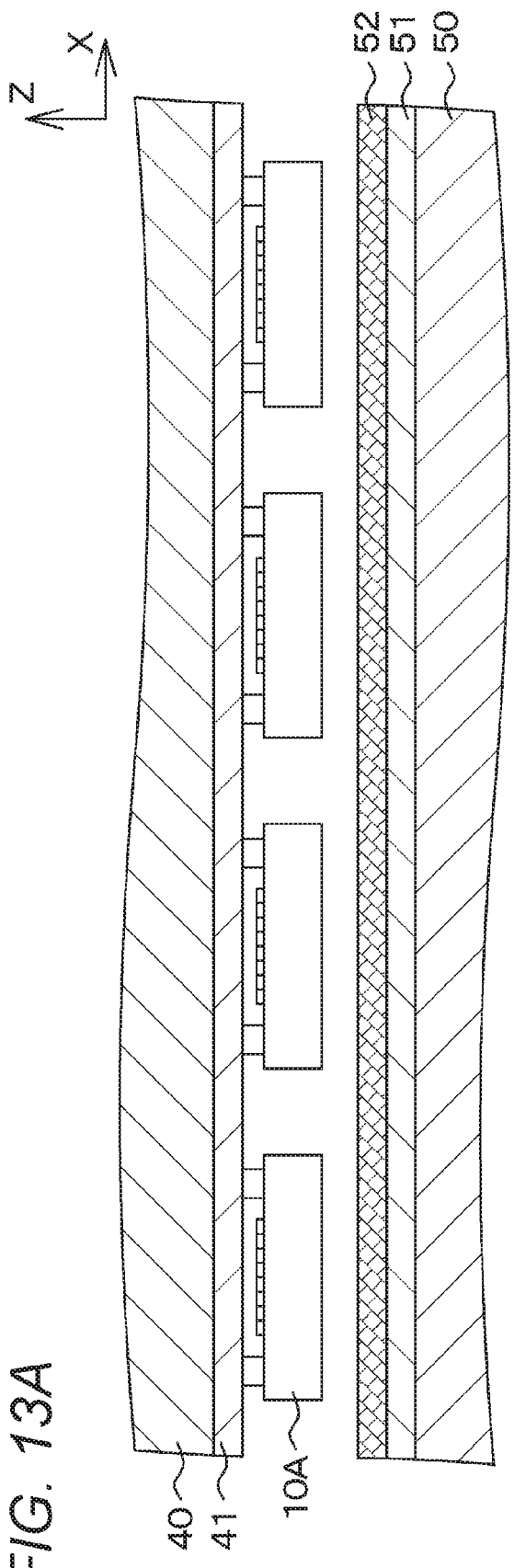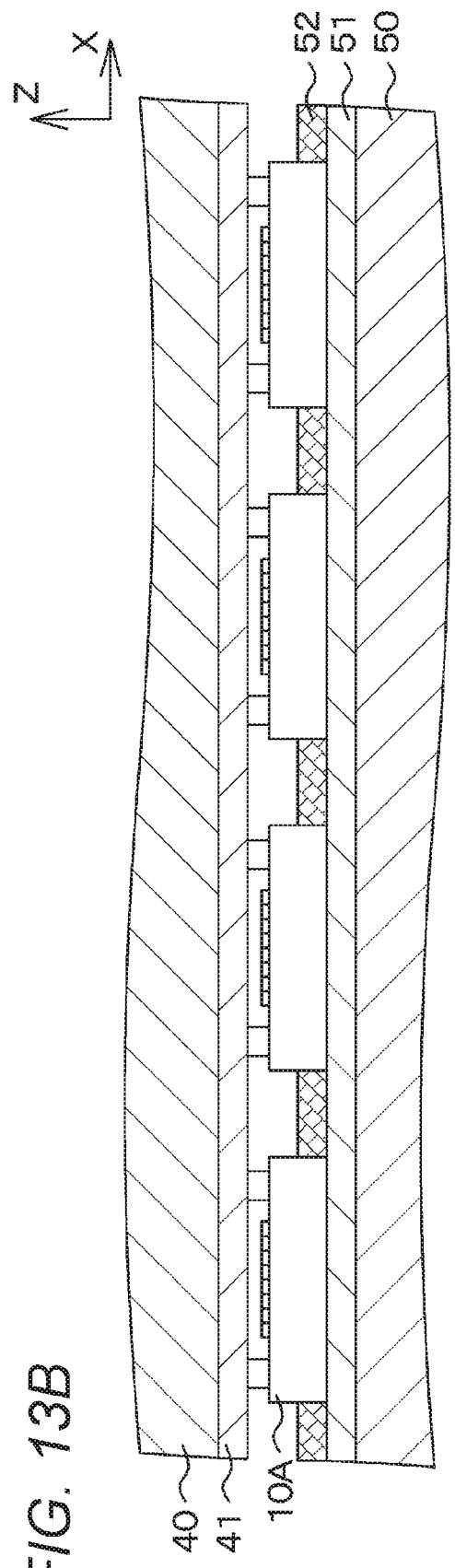

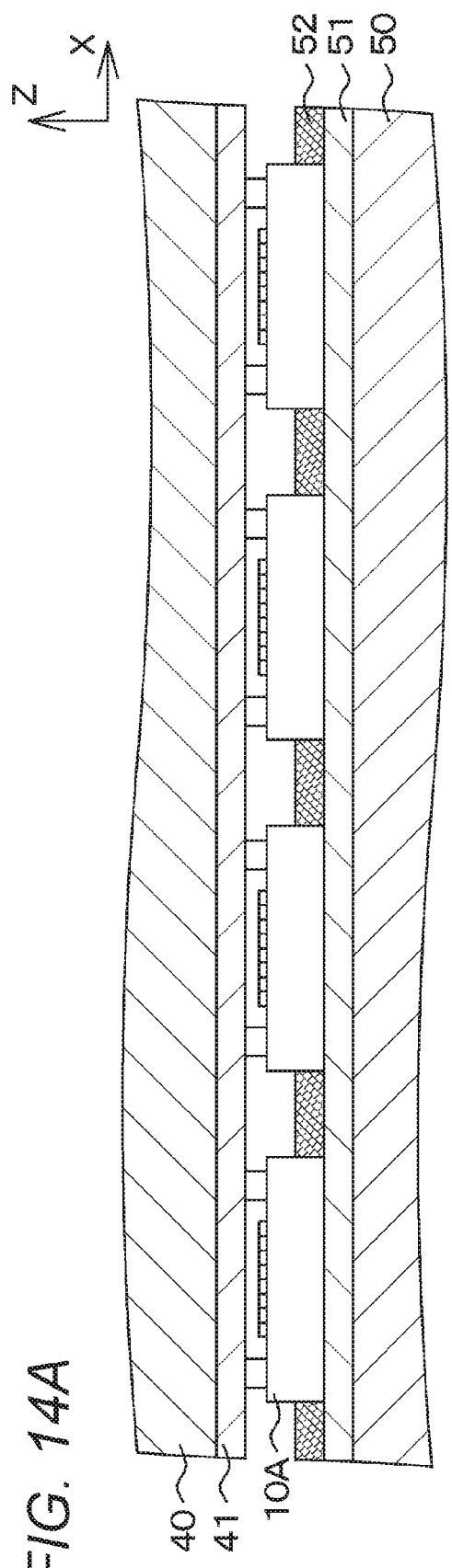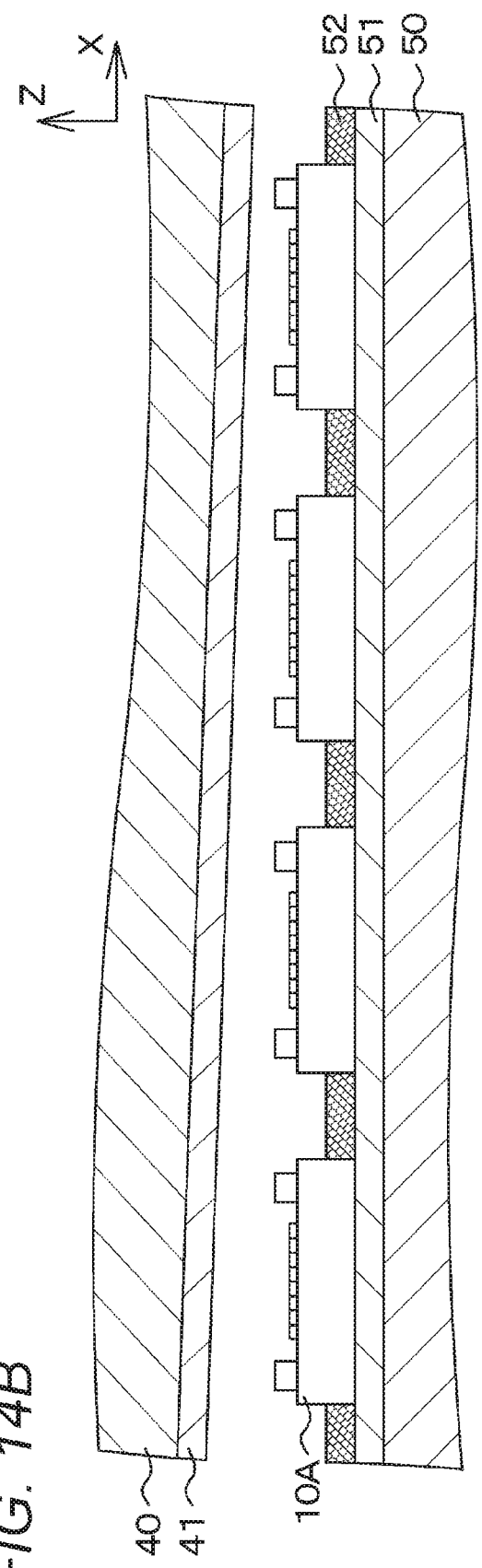

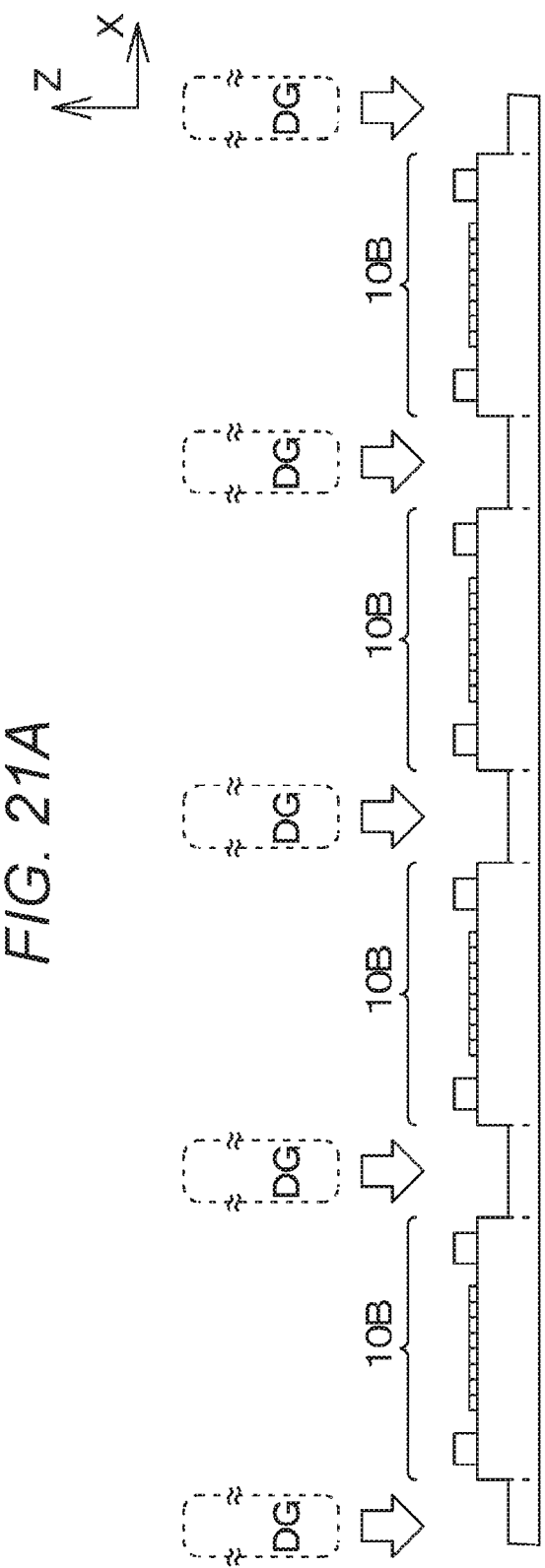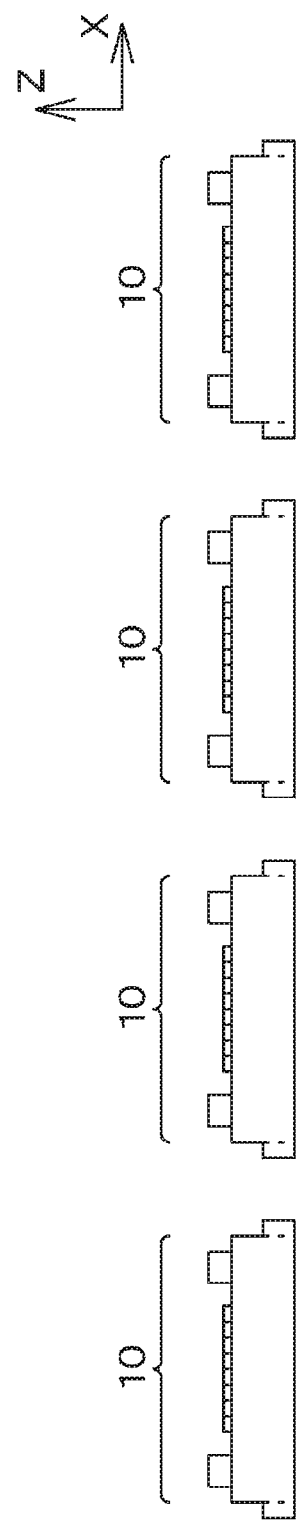

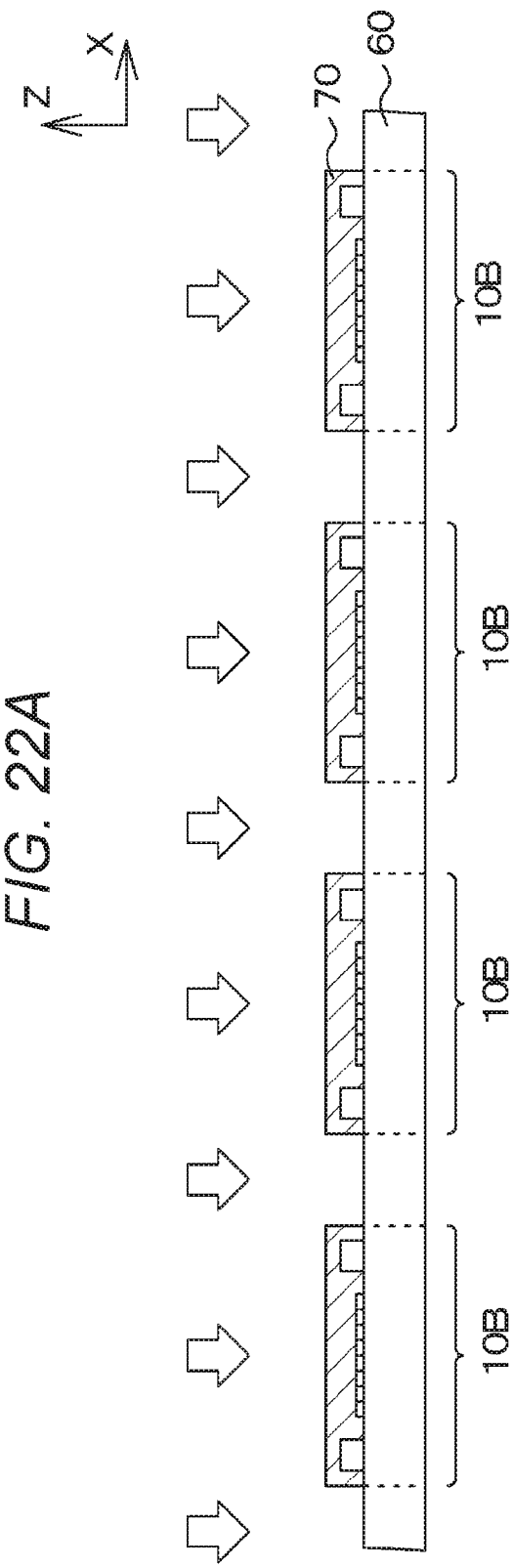
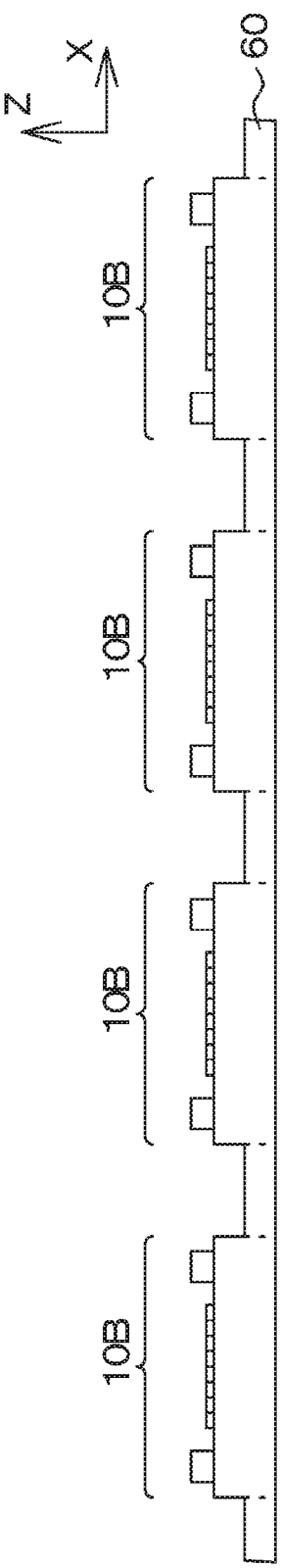

IMAGING ELEMENT, IMAGING DEVICE, ELECTRONIC DEVICE, AND METHOD OF MANUFACTURING IMAGING ELEMENT

CROSS REFERENCE TO RELATED APPLICATIONS

This application is a U.S. National Phase of International Patent Application No. PCT/JP2018/037546 filed on Oct. 9, 2018, which claims priority benefit of Japanese Patent Application No. JP 2017-212206 filed in the Japan Patent Office on Nov. 1, 2017. Each of the above-referenced applications is hereby incorporated herein by reference in its entirety.

TECHNICAL FIELD

The present disclosure relates to an imaging element, an imaging device, an electronic device, and a method of manufacturing the imaging element.

BACKGROUND ART

With miniaturization and thinning of electronic devices, miniaturization and thinning of a package including an imaging element with many terminals are also required. Therefore, a flip-chip mounting system to join a chip-shaped imaging element (hereinafter sometimes simply referred to as a chip) to a wiring substrate such as an interposer substrate is suggested (for example, refer to Japanese Patent Application Laid-Open No. 2011-18766).

In the flip-chip mounting system, usually, the chip and the wiring substrate are electrically joined to each other, then a process of applying a sealing material to a periphery of the chip is performed.

CITATION LIST

Patent Document

Patent Document 1: Japanese Patent Application Laid-Open No. 2011-18766

SUMMARY OF THE INVENTION

Problems to be Solved by the Invention

In a case where flip-chip mounting is performed in a state in which a photoelectric conversion unit of an imaging element faces a wiring substrate side, a sealing material is applied to a periphery of the imaging element, so that a solute and a solvent forming the sealing material penetrate a gap to reach the photoelectric conversion element and might cause a trouble. It is possible to avoid the above-described problem by securing a sufficient distance from an end of the imaging element to the photoelectric conversion unit, but this increases a size of the imaging element and the wiring substrate, thereby increasing a cost.

Therefore, an object of the present disclosure is to provide an imaging element capable of reducing penetration of the solute and solvent forming the sealing material without increasing the size, an imaging device provided with such imaging element, an electronic device provided with such imaging device, and a method for manufacturing such imaging device.

Solutions to Problems

An imaging element according to the present disclosure for achieving the above-described object is an imaging element flip-chip mounted on a wiring substrate, in which a projection is provided on a side surface of the imaging element such that a bottom surface side of the imaging element projects from a top surface side.

An imaging device according to the present disclosure for achieving the above-described object is provided with:

a wiring substrate; and an imaging element, in which a projection is provided on a side surface of the imaging element such that a bottom surface side of the imaging element projects from a top surface side, the imaging element is flip-chip mounted on the wiring substrate such that a top surface faces the wiring substrate, and an outer periphery of the imaging element on the wiring substrate is sealed with a sealing material.

A method of manufacturing an imaging element according to the present disclosure for achieving the above-described object is provided with:

a step of forming a pseudo wafer in a state in which bottom surfaces of imaging elements are arranged on a same surface and a resin material layer thinner than the imaging element is arranged between the imaging elements; and a step of segmenting by performing dicing on the pseudo wafer with a width narrower than a width between imaging elements.

Alternatively, a method of manufacturing an imaging element according to the present disclosure for achieving the above-described object is provided with:

a step of forming a plurality of imaging elements on a semiconductor wafer;

a step of thinning the semiconductor wafer between the imaging elements with a predetermined width from a top surface side of the imaging elements; and a step of segmenting by performing dicing with a width narrower than the predetermined width on a thinned portion of the semiconductor wafer.

An electronic device according to the present disclosure for achieving the above-described object is provided with:

an imaging device obtained by flip-chip mounting an imaging element on a wiring substrate, in which a projection is provided on a side surface of the imaging element such that a bottom surface side of the imaging element projects from a top surface side, the imaging element is flip-chip mounted on the wiring substrate such that a top surface faces the wiring substrate, and an outer periphery of the imaging element on the wiring substrate is sealed with a sealing material.

BRIEF DESCRIPTION OF DRAWINGS

FIGS. 1A and 1B are schematic perspective views for explaining an imaging element according to a first embodiment of the present disclosure. FIG. 1A is the perspective view of the imaging element as seen from a bottom surface side. FIG. 1B is the perspective view of the imaging element as seen from a top surface side.

FIG. 2 is a schematic perspective view for explaining a process when flip-chip mounting an imaging element of a reference example on a wiring substrate.

FIG. 3 is a schematic perspective view for explaining the process when flip-chip mounting the imaging element of the reference example on the wiring substrate continuous from FIG. 2.

FIG. 4 is a schematic perspective view for explaining the process when flip-chip mounting the imaging element of the reference example on the wiring substrate continuous from FIG. 3.

FIG. 6 is a schematic perspective view for explaining a process when flip-chip mounting the imaging element on the wiring substrate.

FIGS. 8A and 8B are schematic cross-sectional views for explaining a configuration example of a side surface of the imaging element. FIG. 8A illustrates a structure in which a portion of a projection (side surface) 12A is formed by using a material different from that of a side surface 12B. FIG. 8B illustrates a structure in which the portion of the projection (side surface) 12A is formed by using a material common to that of the side surface 12B.

FIGS. 13A and 13B are schematic partial cross-sectional views for explaining the method of manufacturing the imaging element according to the second embodiment of the present disclosure continuous from FIG. 12B.

FIGS. 14A and 14B are schematic partial cross-sectional views for explaining the method of manufacturing the imaging element according to the second embodiment of the present disclosure continuous from FIG. 13B.

FIGS. 21A and 21B are schematic partial cross-sectional views for explaining the method of manufacturing the imaging element according to the third embodiment of the present disclosure continuous from FIG. 20B.

FIGS. 22A and 22B are schematic partial cross-sectional views for explaining a method of manufacturing an imaging element according to a fourth embodiment of the present disclosure.

Figure 5A:
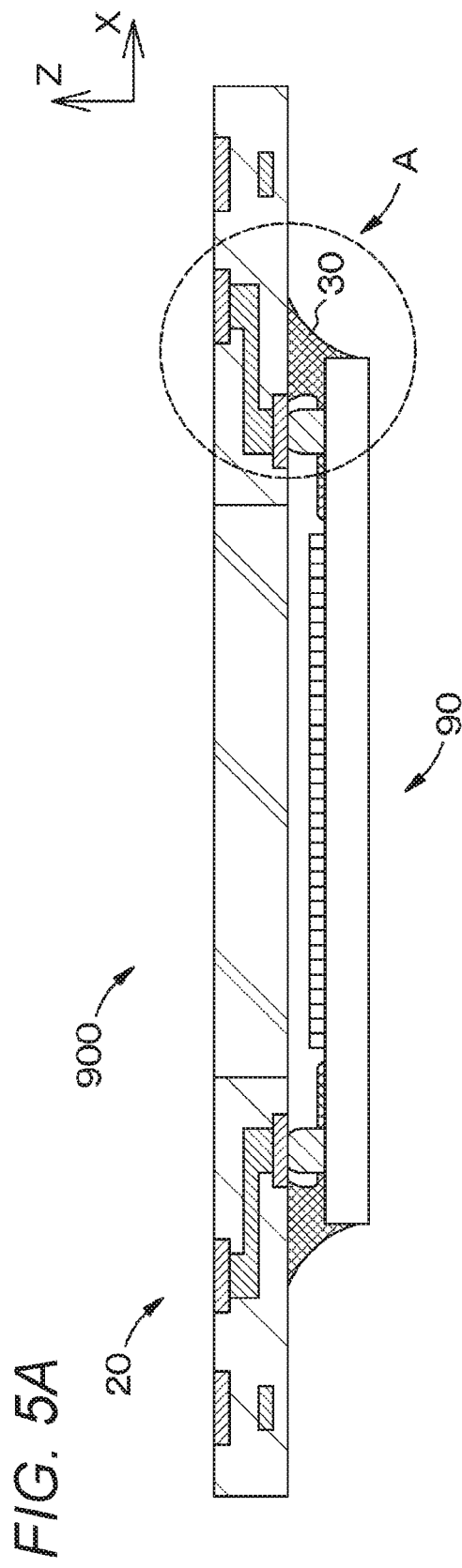
FIG. 5A is a schematic cross-sectional view of an imaging device provided with the flip-chip mounted imaging element.

Hereinafter, the present disclosure is described on the basis of embodiments with reference to the drawings. The present disclosure is not limited to the embodiments, and various numerical values and materials in the embodiments are examples. In the following description, the same reference sign is used for the same elements or elements having the same function, and the description is not repeated. Note that, the description is given in the following order.

1. Description in General regarding Imaging Element, Imaging Device, Electronic Device, and Method of Manufacturing Imaging Element according to Present Disclosure
2. First Embodiment
3. Second Embodiment
4. Third Embodiment
5. Fourth Embodiment
6. Fifth Embodiment: Application Example
7. Others DESCRIPTION IN GENERAL REGARDING IMAGING ELEMENT, IMAGING DEVICE, ELECTRONIC DEVICE, AND METHOD OF MANUFACTURING IMAGING ELEMENT ACCORDING TO PRESENT DISCLOSURE In an imaging element according to the present disclosure, an imaging element used in an imaging device and an electronic device according to the present disclosure, and an imaging element manufactured by a method of manufacturing the imaging element according to the present disclosure (hereinafter they are sometimes simply referred to as the imaging element of the present disclosure), as described above, a projection is provided on a side surface of the imaging element such that a bottom surface side of the imaging element projects from a top surface side.

In the imaging element according to the present disclosure, a photoelectric conversion unit may be provided on a top surface of the imaging element.

In the imaging element according to the present disclosure having the above-described preferable configuration, the projection may be formed using a part of a semiconductor substrate that forms the imaging element.

Alternatively, the projection may be formed by using a material different from that of the semiconductor substrate forming the imaging element. In this case, the projection may be formed by using a resin material. From the viewpoint of affinity with the semiconductor substrate, the resin material preferably includes a thermosetting resin material (for example, thermosetting resin including epoxy resin or acrylic resin).

In the imaging element according to the present disclosure having the above-described various preferable configurations, a thickness of the projection is preferably half a thickness of the semiconductor substrate that forms the imaging element. Furthermore, it is preferable that a projecting width of the projection is one quarter of the thickness of the semiconductor substrate forming the imaging element or smaller.

As described above, an imaging device according to the present disclosure is provided with:

a wiring substrate; and an imaging element, in which a projection is provided on a side surface of the imaging element such that a bottom surface side of the imaging element projects from a top surface side, the imaging element is flip-chip mounted on the wiring substrate such that a top surface faces the wiring substrate, and an outer periphery of the imaging element on the wiring substrate is sealed with a sealing material.

In the imaging device according to the present disclosure, as described above, the photoelectric conversion unit may be provided on the top surface of the imaging element. In this case, a light receiving window may be provided in a portion of the wiring substrate facing the photoelectric conversion unit. The light receiving window may be a simple opening or may be provided with a seal glass and the like.

A material forming the sealing material used in the present disclosure is not especially limited as long as there is no obstacle in implementing the present disclosure. For example, thermosetting resin or resin cured by ultraviolet irradiation may be used, and examples thereof may include epoxy resin, polyimide resin, acrylic resin and the like. Note that, the resin may include an insulating filler.

As described above, a method of manufacturing an imaging element according to the present disclosure is provided with:

a step of forming a pseudo wafer in a state in which bottom surfaces of imaging elements are arranged on a same surface and a resin material layer thinner than the imaging element is arranged between the imaging elements; and a step of segmenting by performing dicing on the pseudo wafer with a width narrower than a width between the imaging elements. From the viewpoint of affinity with the semiconductor substrate, the resin material layer preferably includes thermosetting resin (for example, thermosetting resin including epoxy resin, acrylic resin or the like).

Alternatively, a method of manufacturing an imaging element according to the present disclosure is provided with:

a step of forming a plurality of imaging elements on a semiconductor wafer;

a step of thinning the semiconductor wafer between the imaging elements with a predetermined width from a top surface side of the imaging elements; and a step of segmenting by performing dicing with a width narrower than the predetermined width on a thinned portion of the semiconductor wafer.

In this case, a dicing blade with a predetermined width may be used to thin a space between the imaging elements with the predetermined width, and a dicing blade with a narrower width than the predetermined width may be used to perform segmentation. Alternatively, an etching technique may be used to thin a space between imaging elements with a predetermined width, and a dicing blade with a narrower width than the predetermined width may be used to perform segmentation.

As pixel values of the imaging element, in addition to U-XGA (1600,1200), HD-TV (1920,1080), and Q-XGA (2048,1536), some resolution for image such as (3840,2160) and (7680,4320) may be exemplified; however, the values are not limited thereto.

Furthermore, as an electronic device provided with an imaging device according to the present disclosure, various electronic devices such as an imaging system such as a digital still camera and a digital video camera, a portable phone having an imaging function, or another device having the imaging function may be exemplified.

Various conditions in this specification are satisfied not only in a case where they are strictly established but also in a case where they are substantially established. Existence of various variations caused in design or during manufacture is allowed. Furthermore, the drawings used in the following description are schematic and do not illustrate actual dimensions or ratios.

First Embodiment

A first embodiment relates to an imaging element according to the present disclosure and an imaging device according to the present disclosure.

FIGS. 1A and 1B are schematic perspective views for explaining the imaging element according to the first embodiment of the present disclosure. FIG. 1A is the perspective view of the imaging element as seen from a bottom surface side. FIG. 1B is the perspective view of the imaging element as seen from a top surface side.

Note that, for convenience of illustration and explanation, in FIGS. 1A and 1B, various components provided in an imaging element 10 are exaggerated.

The imaging element 10 is an imaging element flip-chip mounted on a wiring substrate. On a side surface of the imaging element 10, a projection is provided so that a bottom surface 11 side projects from a top surface 13 side. More specifically, a side surface 12 of the imaging element 10 includes a side surface 12A on the bottom surface 11 side and a side surface 12B on the top surface 13 side. Then, a portion of the side surface 12A that projects from the side surface 12B forms the projection. Hereinafter, the side surface 12A is sometimes referred to as a projection 12A. The projection 12A is provided over an entire periphery of the imaging element 10.

The top surface 13 of the imaging element 10 is provided with an electrode 15 formed by using a solder bump and the like and a photoelectric conversion unit 14. The photoelectric conversion unit 14 includes, for example, pixels each obtained by combining a photoelectric conversion element including a photodiode (PD) and the like, a floating diffusion region (FD) to which photoelectrically converted charge is transferred, a plurality of transistors and the like are arranged in a two-dimensional matrix.

The imaging element 10 may have a configuration to capture a monochrome image or a configuration to capture a color image. In a case of the configuration to capture the color image, a color filter is usually arranged on a light incident surface side of the photoelectric conversion unit 14. For example, in a case of capturing the color image of Bayer array, color imaging is performed using a group of photoelectric conversion elements corresponding to [red, green, green, blue].

Here, in order to help understanding of the present disclosure, a manufacturing process of an imaging device including an imaging element of a reference example in which a side surface of the imaging element is a flat surface is described with reference to FIGS. 2 to 4. Thereafter, a problem of the reference example is described with reference to FIG. 5.

FIG. 2 is a schematic perspective view for explaining a process when flip-chip mounting the imaging element of the reference example on a wiring substrate. FIG. 3 is a schematic perspective view for explaining the process when flip-chip mounting the imaging element of the reference example on the wiring substrate continuous from FIG. 2. FIG. 4 is a schematic perspective view for explaining the process when flip-chip mounting the imaging element of the reference example on the wiring substrate continuous from FIG. 3.

An imaging element 90 of the reference example has a configuration similar to that of the imaging element 10 illustrated in FIG. 1 except that a side surface 92 is a flat surface without projection. When flip-chip mounting is performed, first, the imaging element 90 is arranged so that a top surface 93 faces a wiring substrate 20 (refer to FIG. 2). On the wiring substrate 20, a light receiving window 21 is provided in a portion facing the photoelectric conversion unit 14. Reference numeral 22 represents an electrode provided on the wiring substrate 20.

The imaging element 90 and the wiring substrate 20 are electrically connected to each other in a state in which the imaging element 90 and the wiring substrate 20 are arranged so as to face each other. An electrically connecting method is only required to be appropriately selected from well-known methods such as a pressure welding method, an ultrasonic bonding method, and a reflow method used for flip-chip connection to be used. For example, an electrode 15 of the imaging element 90 is formed by using a solder bump, and a reflow process is performed in a state in which the imaging element 90 is placed on the wiring substrate 20. When the solder bump melts, the electrode 15 of the imaging element 90 and the electrode 22 of the wiring substrate 20 may be electrically connected to each other (refer to FIG. 3).

After the imaging element 90 and the wiring substrate 20 are electrically connected to each other, a sealing material 30 including a liquid resin material is applied to an outer periphery of the imaging element 90 (refer to FIG. 4). Thereafter, by performing a curing process, an imaging element 900 including the imaging element 90 of the reference example may be obtained.

Figure 5B:
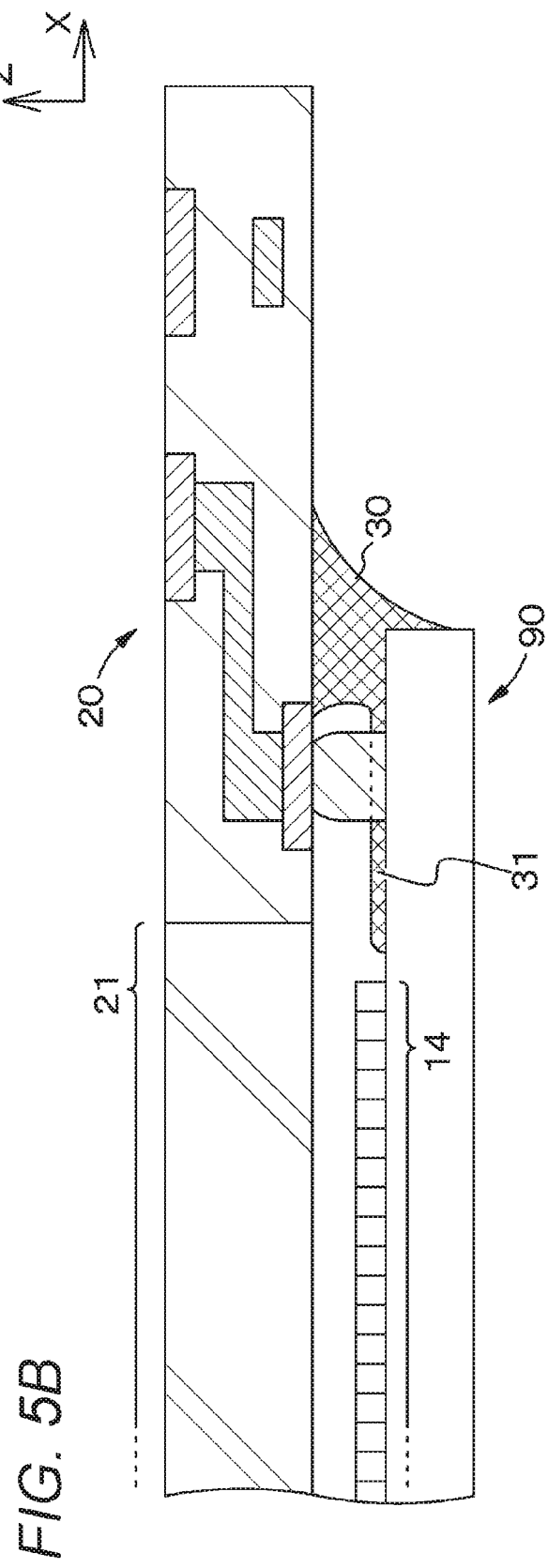
FIG. 5B is an enlarged view of a portion represented by reference sign A in FIG. 5A.

Subsequently, the problem of the reference example is described. FIG. 5A is a schematic cross-sectional view of the imaging device provided with the flip-chip mounted imaging element. FIG. 5B is an enlarged view of a portion represented by reference sign A in FIG. 5A.

As illustrated in FIG. 5B, when the liquid sealing material 30 is applied to the outer periphery of the imaging element 90, a solute and a solvent forming the sealing material 30 penetrate into a gap. Reference sign 31 represents the solute or solvent that penetrate. When they reach the photoelectric conversion unit 14, this might hinder imaging. It is possible to avoid the above-described problem by securing a sufficient distance from an end of the imaging element 90 to the photoelectric conversion unit 14, but this increases a size of the imaging element and the wiring substrate.

The problem of the reference example is described above.

As described above, the imaging element 10 according to the first embodiment is the imaging element that is flip-chip mounted on the wiring substrate. Then, on the side surface of the imaging element 10, the projection 12A is provided so that the bottom surface side of the imaging element 10 projects from the top surface side. An outer periphery of the imaging element 10 on the wiring substrate is sealed with a sealing material, but the liquid sealing material applied around the imaging element 10 flows so as to be attracted to the projection 12A on the side surface, so that the solute and solvent forming the sealing material are less likely to penetrate into the gap as a result. Hereinafter, this is described in detail with reference to FIGS. 6, 7A, and 7B.

FIG. 6 is a schematic perspective view for explaining a process when flip-chip mounting the imaging element on the wiring substrate.

The process of making the imaging element 10 and the wiring substrate 20 face each other and then electrically connecting them is similar to the process described with reference to FIGS. 2 and 3 for the reference example, so that the description thereof is omitted. After the imaging element 10 and the wiring substrate 20 are electrically connected, the sealing material 30 including the liquid resin material is applied to the outer periphery of the imaging element 10 (refer to FIG. 6; note that, for convenience of illustration, the sealing material 30 is partially cut). Thereafter, by performing a curing process, an imaging device 100 provided with the imaging element 10 may be obtained.

As described above, the imaging device 100 according to the second embodiment is the imaging device provided with:
the wiring substrate 20; and the imaging element 10,
in which the projection 12A is provided on the side surface of the imaging element 10 such that the bottom surface 11 side of the imaging element 10 projects from the top surface 13 side,
the imaging element 10 is flip-chip mounted on the wiring substrate 20 such that the top surface 13 faces the wiring substrate 20, and
the outer periphery of the imaging element 10 on the wiring substrate 20 is sealed with the sealing material 30.

Figure 7A:
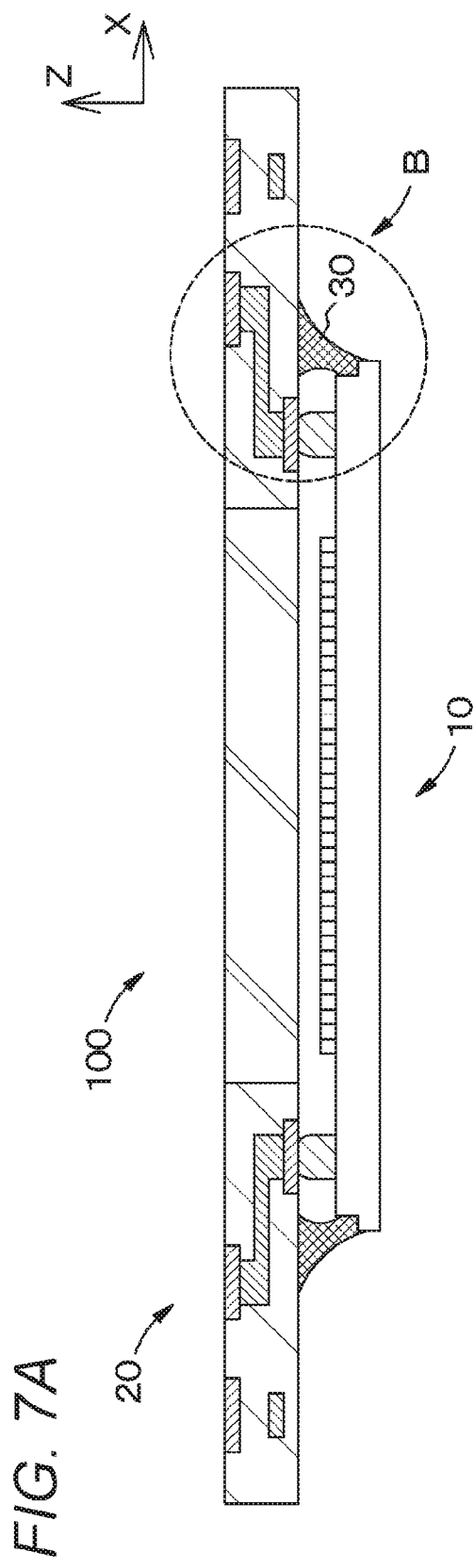
FIG. 7A is a schematic cross-sectional view of the imaging device provided with the flip-chip mounted imaging element.
Figure 7B:
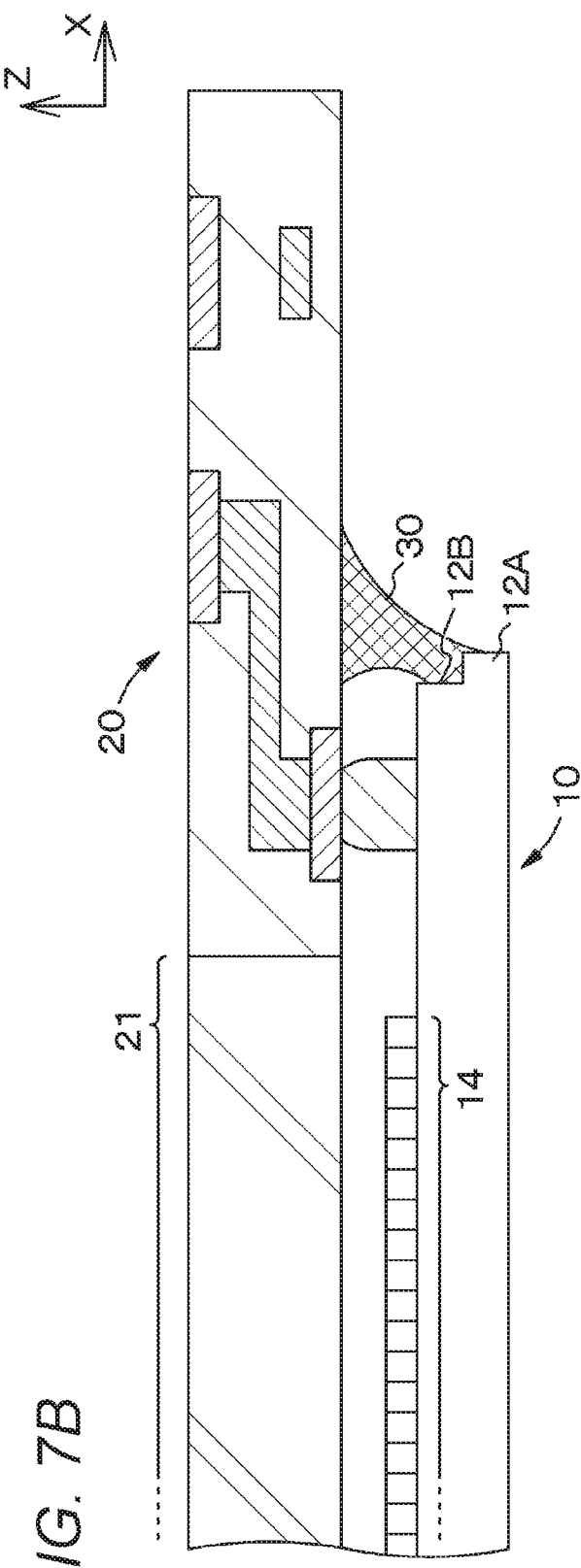
FIG. 7B is an enlarged view of a portion represented by reference sign B in FIG. 7A.

FIG. 7A is a schematic cross-sectional view of the imaging device provided with the flip-chip mounted imaging element. FIG. 7B is an enlarged view of a portion represented by reference sign B in FIG. 7A.

As illustrated in FIG. 7B, the liquid sealing material 30 applied around the imaging element 10 flows so as to be attracted to the projection 12A on the side surface, so that the solute and solvent forming the sealing material 30 are less likely to penetrate into the gap as a result. Therefore, it becomes possible to reduce a level at which the solute and solvent forming the sealing material 30 reach the photoelectric conversion unit 14 without increasing the size of the imaging element and the wiring substrate.

Subsequently, a material forming the projection 12A is described. FIGS. 8A and 8B are schematic cross-sectional views for explaining a configuration example of the side surface of the imaging element.

FIG. 8A illustrates a structure in which a portion of a projection (side surface) 12A is formed by using a material different from that of a side surface 12B. For example, a configuration in which the projection 12A formed by using a resin material is formed on a side surface of a semiconductor substrate forming the imaging element 10 corresponds to this. In such a case, from the viewpoint of affinity with the semiconductor substrate, the resin material preferably includes epoxy resin or acrylic resin.

FIG. 8B illustrates a structure in which the portion of the projection (side surface) 12A is formed by using a material common to that of the side surface 12B. For example, a configuration in which the projection 12A includes a part of the semiconductor substrate that forms the imaging element 10 corresponds to this.

Figure 9:
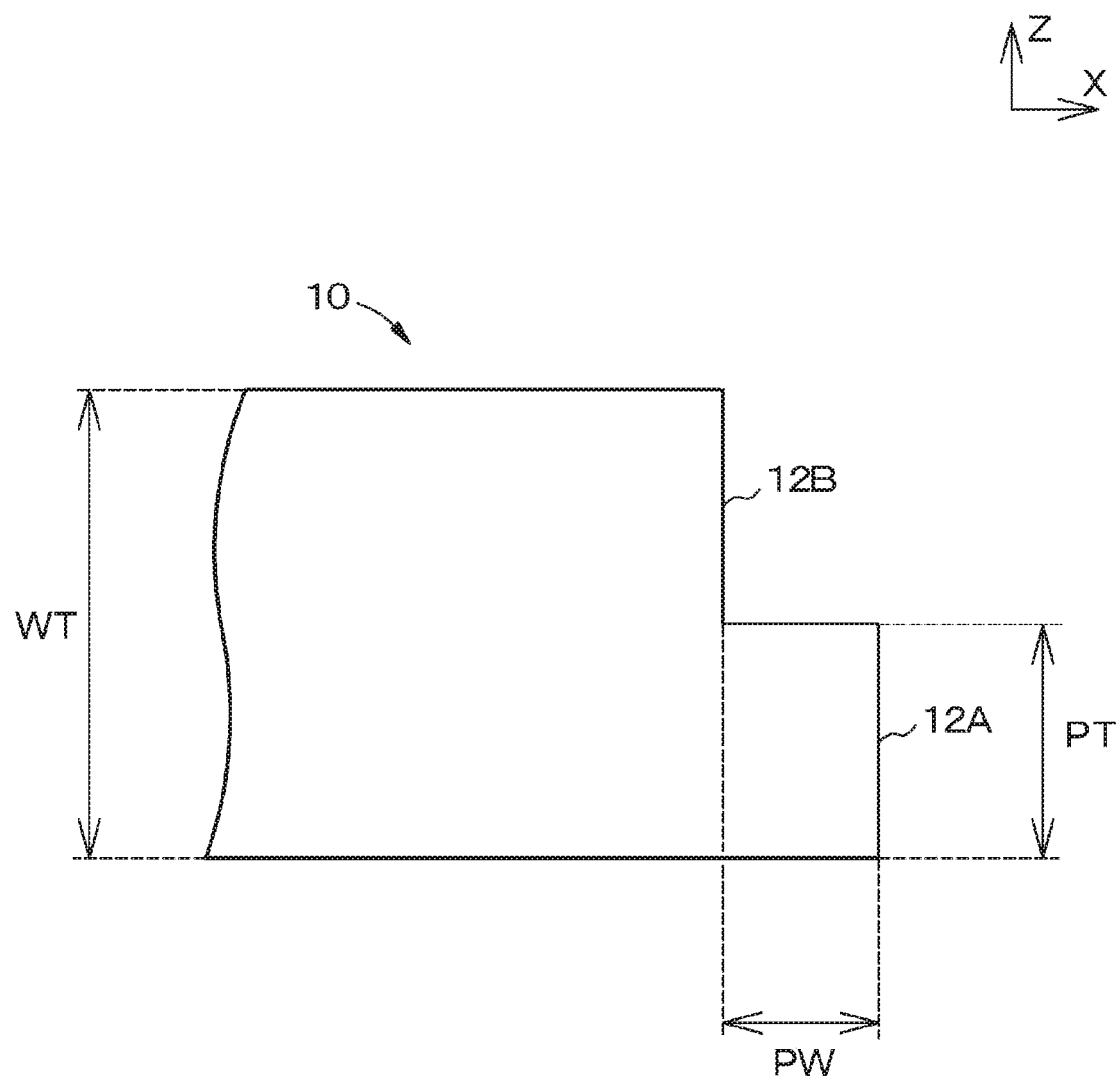
FIG. 9 is a schematic enlarged view for explaining a thickness and a projecting width of the projection.

Subsequently, a projecting width and a thickness of the projection 12A are described. FIG. 9 is a schematic enlarged view for explaining the thickness and the projecting width of the projection.

The thickness of the projection 12A is preferably half the thickness of the semiconductor substrate forming the imaging element 10 or smaller. Therefore, in FIG. 9, a relationship of PT<WT/2 is preferable.

Furthermore, the projecting width of the projection 12A is preferably one-quarter of the thickness of the semiconductor substrate forming the imaging element or smaller. Therefore, in FIG. 9, a relationship of PW<WT/4 is preferable.

Second Embodiment

A second embodiment relates to a method of manufacturing an imaging element.

More specifically, the second embodiment relates to a method of manufacturing an imaging element provided with:

a step of forming a pseudo wafer in a state in which bottom surfaces of imaging elements are arranged on a same surface and a resin material layer thinner than the imaging element is arranged between the imaging elements; and a step of segmenting by performing dicing with a width narrower than a width between the imaging elements on the pseudo wafer.

Hereinafter, with reference to FIGS. 10A, 10B, 11, 12A, 12B, 13A, 13B, 14A, 14B, 15, 16, 17A, and 17B, the method of manufacturing the imaging element according to the second embodiment of the present disclosure is described.

Figure 10A:
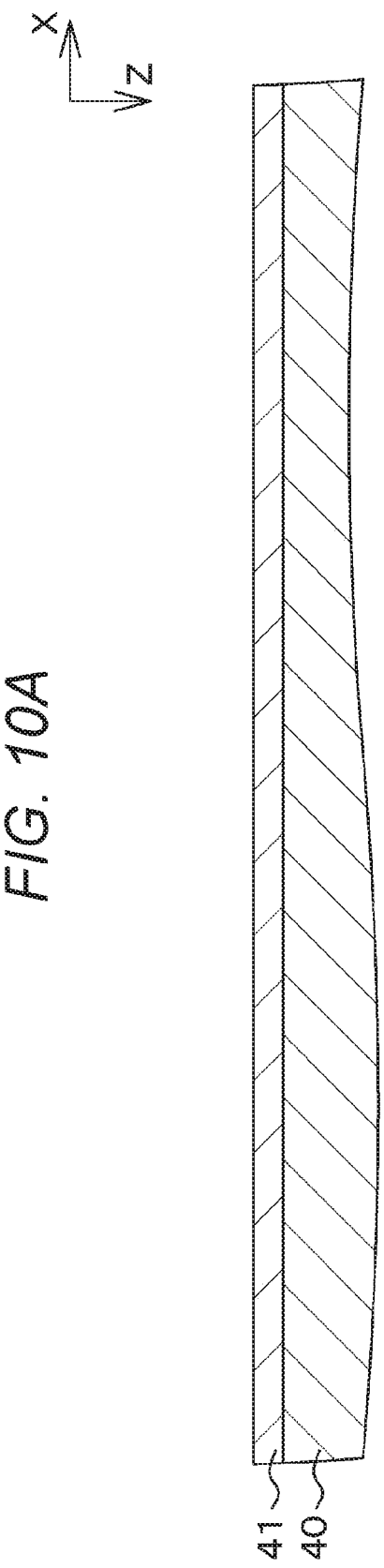
FIGS. 10A and 10B are schematic partial cross-sectional views for explaining a method of manufacturing an imaging element according to a second embodiment of the present disclosure.
Figure 10B:
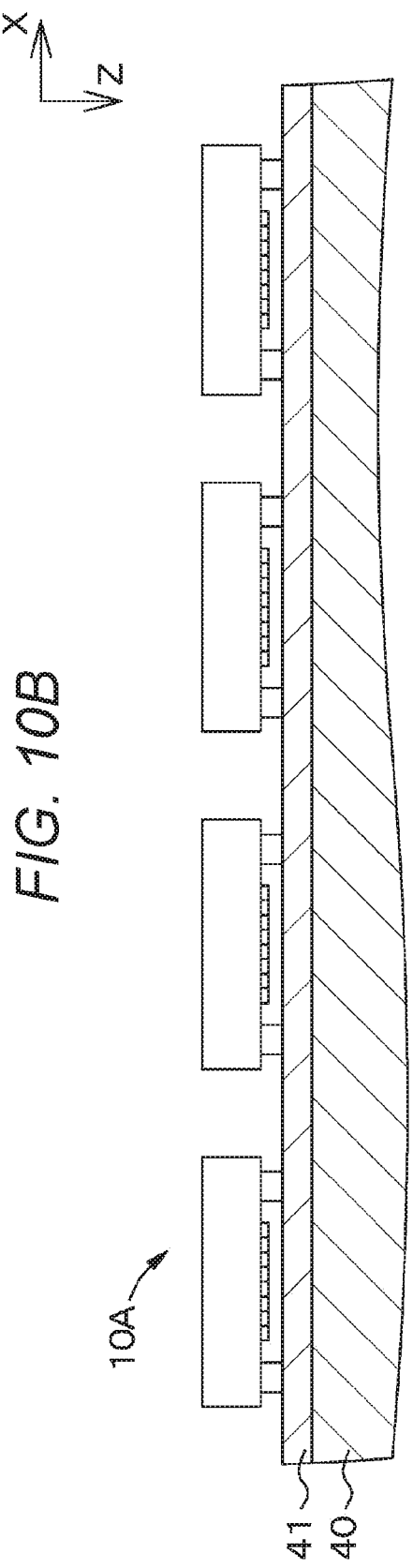
Figure 11:
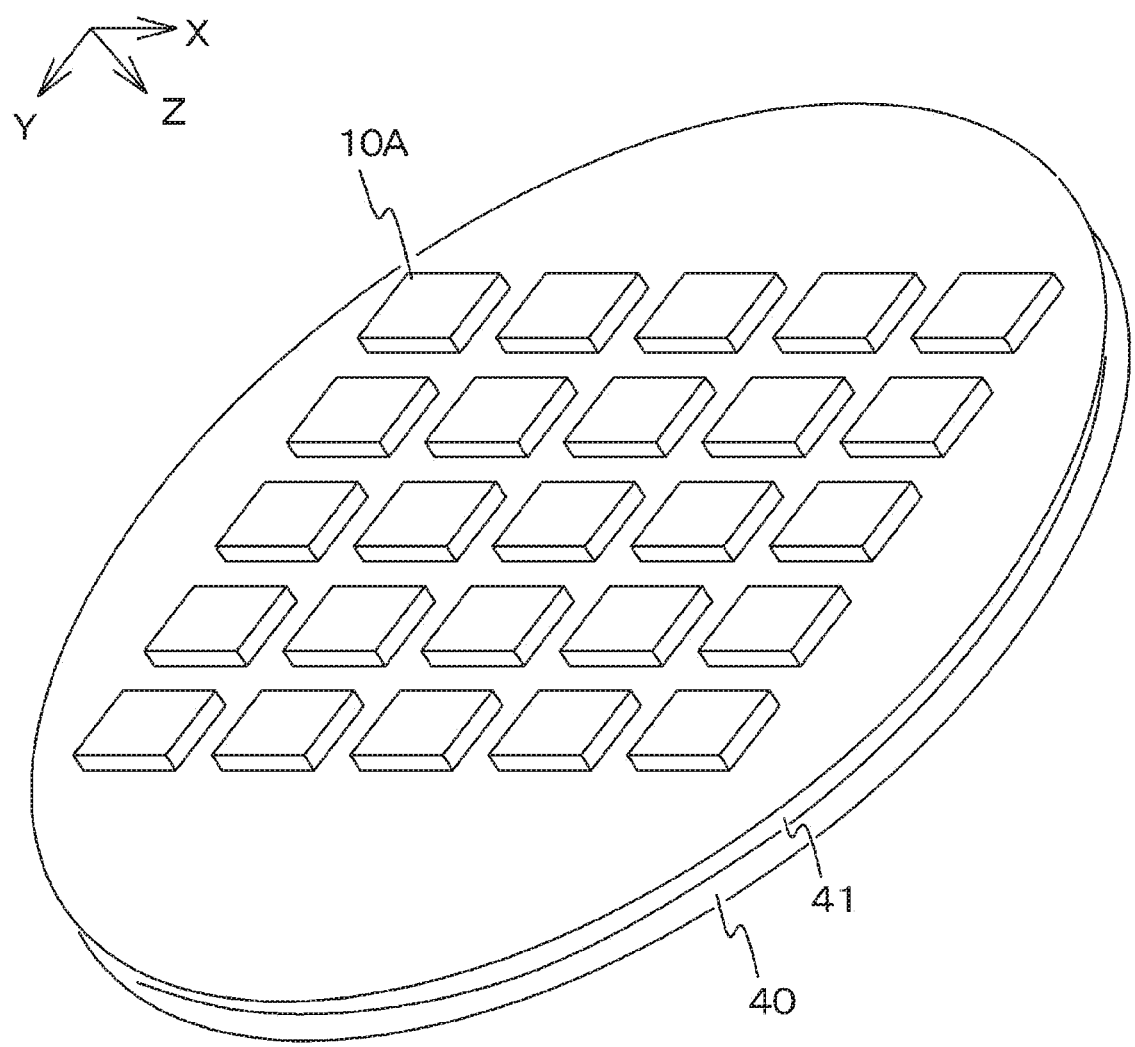
FIG. 11 is a schematic perspective view for explaining a pseudo wafer that may be obtained at a step illustrated in FIG. 10B.

[Step-200] (Refer to FIGS. 10A and 10B and FIG. 11)

A support substrate 40 is prepared, and a peelable adhesive layer 41 is formed thereon (refer to FIG. 10A). A planar shape of the support 40 is, for example, a disk shape having a diameter of about 300 mm. As the support 40, a metal substrate, a glass substrate, a semiconductor substrate, a ceramic substrate and the like may be used.

Next, imaging elements 10A having a flat side surface are prepared and are arranged at a predetermined interval so that a top surface side faces the adhesive layer 41 (refer to FIG. 10B). Note that, the imaging element 10A has a configuration in which, for example, the projection 12A is omitted from the imaging element 10 illustrated in FIG. 8A.

FIG. 11 is a schematic perspective view for explaining the pseudo wafer that may be obtained by the step illustrated in FIG. 10B. Note that, for convenience of illustration, in FIG. 11, dimensions and arrangement of the imaging elements are exaggerated. This is similar for FIG. 15 described later.

Figure 12A:
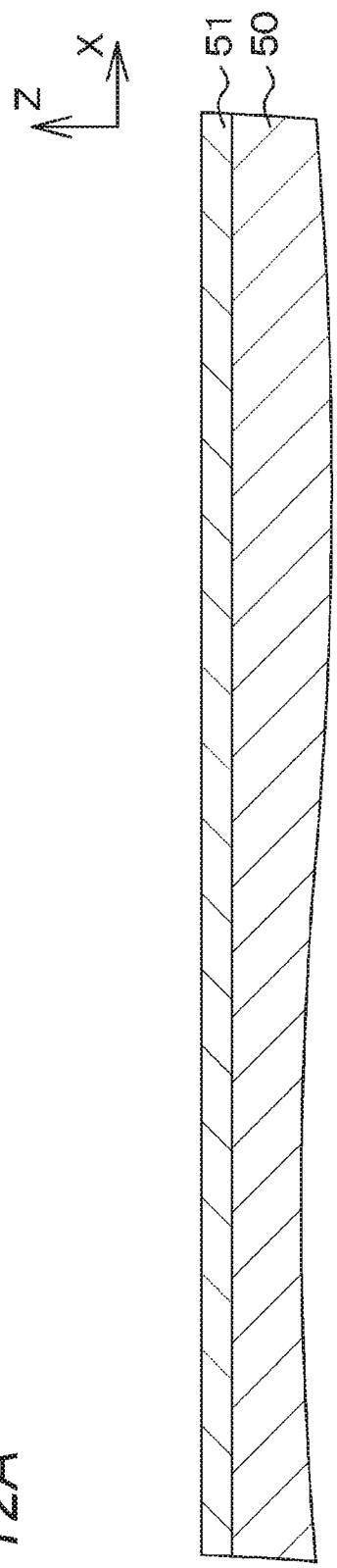
FIGS. 12A and 12B are schematic partial cross-sectional views for explaining the method of manufacturing the imaging element according to the second embodiment of the present disclosure continuous from FIG. 10B.
Figure 12B:
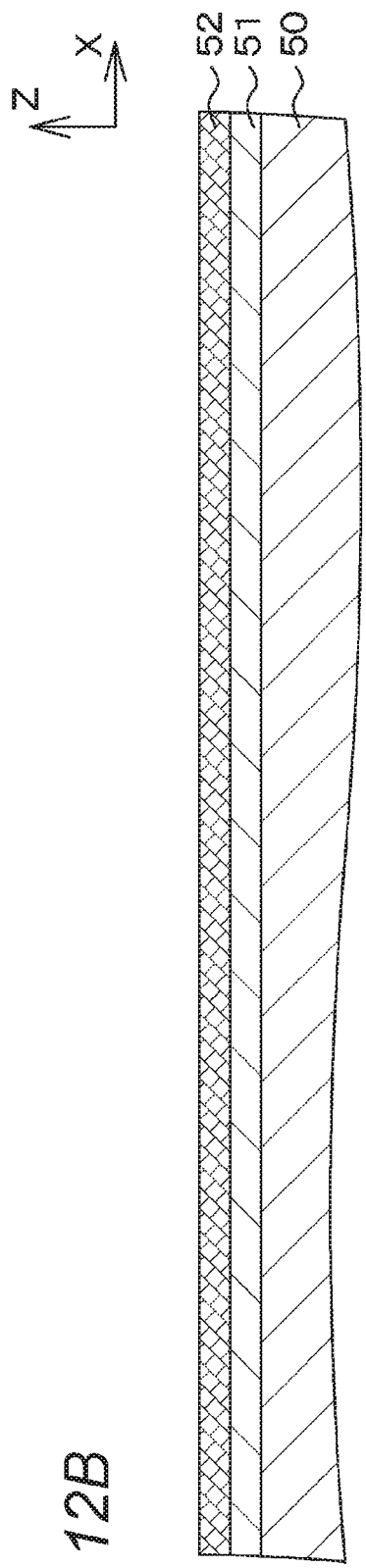

[Step-210] (Refer to FIGS. 12A and 12B)

A support substrate 50 is prepared, and a peelable adhesive layer 51 is formed thereon (refer to FIG. 12A). A planar shape of the support 50 is, for example, a disk shape having a diameter of about 300 mm. As the support 50, a metal substrate, a glass substrate, a semiconductor substrate, a ceramic substrate and the like may be used.

Next, a resin material layer 52 including a thermosetting resin material is formed on the adhesive layer 51. A method of forming the resin material layer is not especially limited. For example, this may be applied by various printing methods such as a spin coating method, a spray coating method, and a printing method. From the viewpoint of affinity with the semiconductor substrate, the resin material layer 52 preferably includes epoxy resin or acrylic resin.

[Step-220] (Refer to FIGS. 13A and 13B)

Thereafter, a display element 10A on the pseudo wafer obtained at [Step-200] is mounted on the resin material layer 52. First. the pseudo wafer is arranged so that a bottom surface of the imaging element 10A on the support 40 faces the resin material layer 52 (refer to FIG. 13A), and then a pressure is applied to mount the display element 10A on the resin material layer 52 (refer to FIG. 13B).

As illustrated in FIG. 13B, the resin material layer 52 is located between the imaging element 10A and the imaging element 10A. An application thickness of the resin material layer 52 in FIG. 12B is only required to be set so that the resin material layer 52 is thinner than the imaging element 10A in this state. [Step-230] (refer to FIGS. 14A and 14B and FIG. 15)

Figure 15:
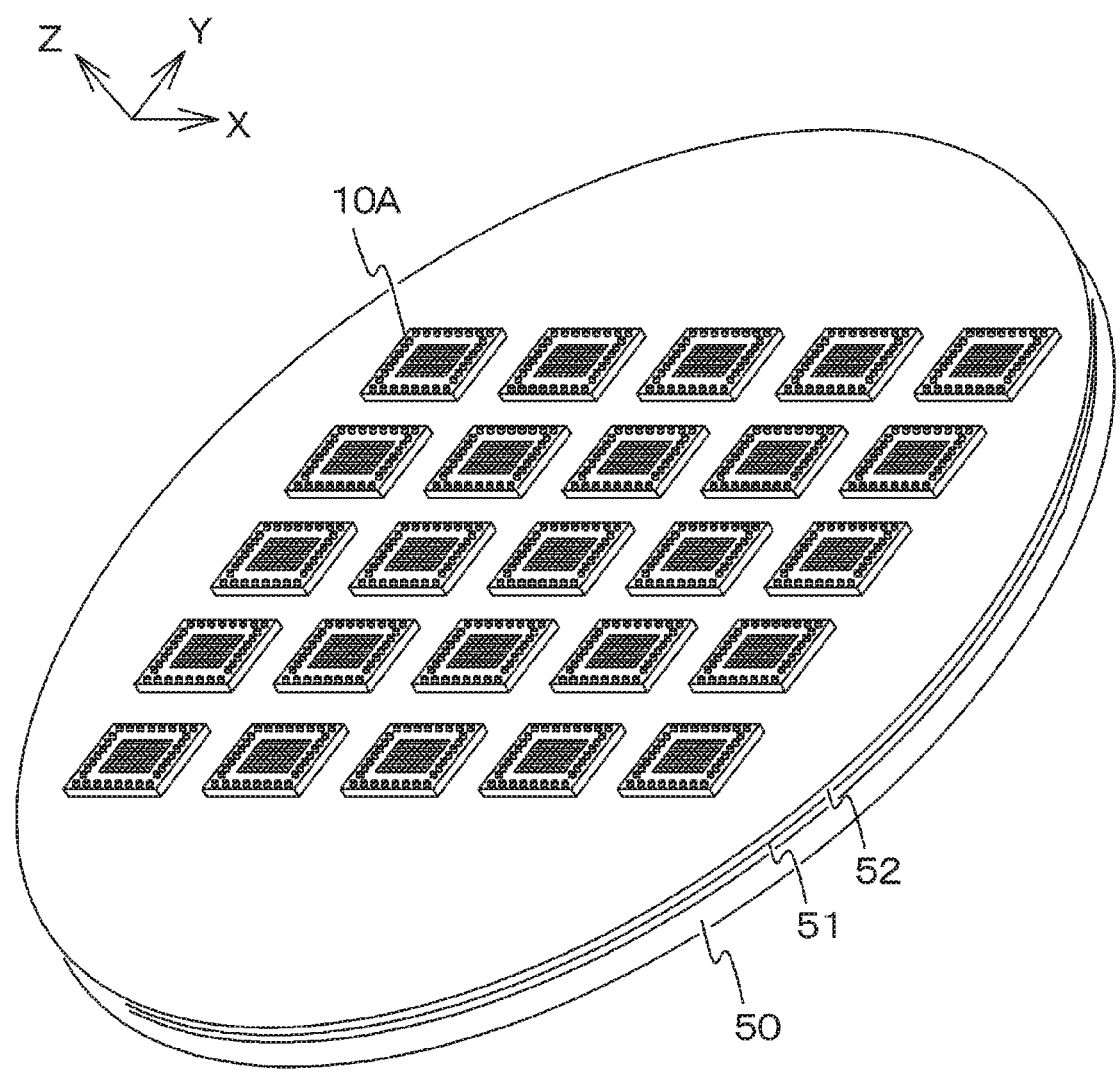
FIG. 15 is a schematic perspective view for explaining a pseudo wafer that may be obtained at a step illustrated in FIG. 14B.

Next, the resin material layer 52 is subjected to a curing process (refer to FIG. 14A). The resin material layer 52 is finely hatched to indicate that this is after curing. Thereafter, the adhesive layer 41 is peeled off (refer to FIG. 14B). FIG. 15 is a schematic perspective view for explaining the pseudo wafer that may be obtained at the step illustrated in FIG. 14B.

By the above-described steps, the pseudo wafer in a state in which the bottom surfaces of the imaging elements are arranged on the same surface and the resin material layer thinner than the imaging element is arranged between the imaging elements may be formed.

Figure 16:
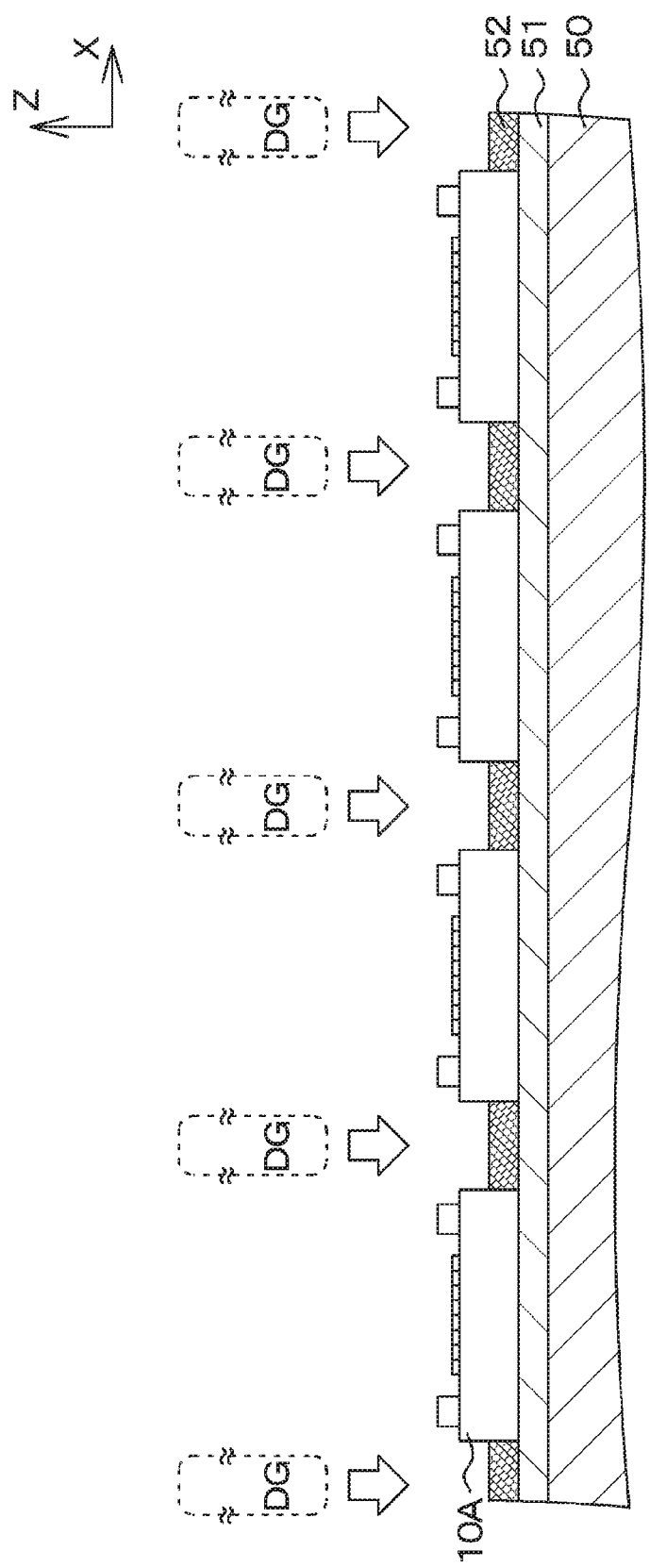
FIG. 16 is a schematic partial cross-sectional view for explaining the method of manufacturing the imaging element according to the second embodiment of the present disclosure continuous from FIG. 14B.
Figure 17A:
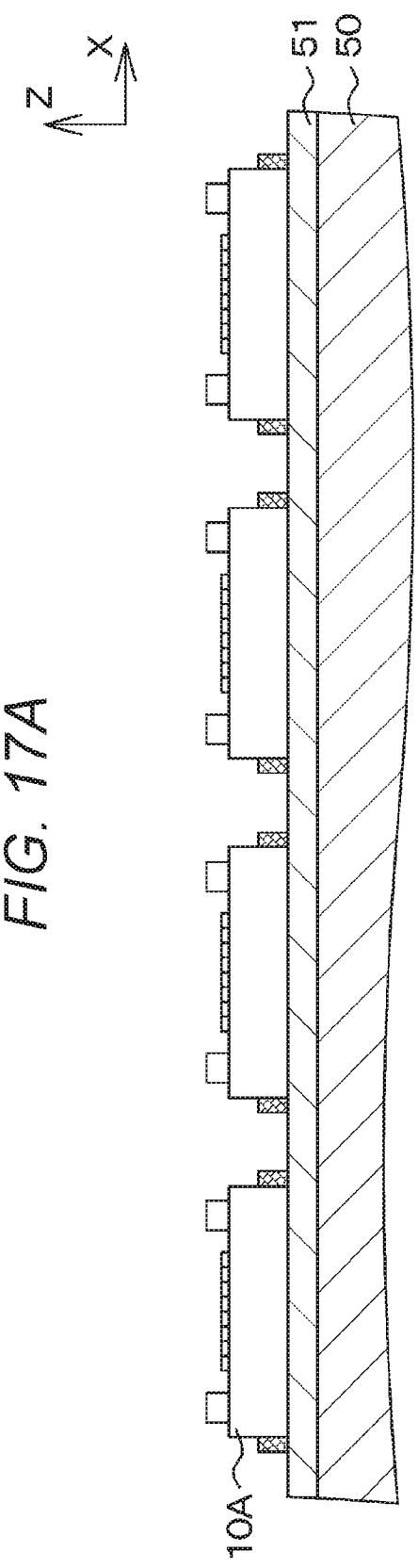
FIGS. 17A and 17B are schematic partial cross-sectional views for explaining the method of manufacturing the imaging element according to the second embodiment of the present disclosure continuous from FIG. 16.
Figure 17B:
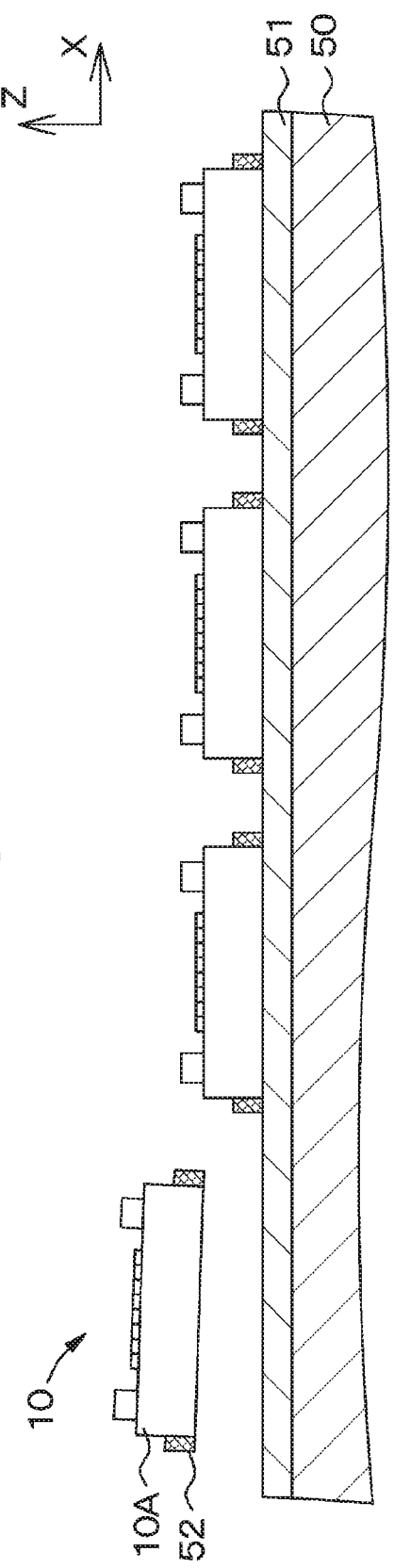

[Step-240] (Refer to FIG. 16 and FIGS. 17A and 17B)

Thereafter, dicing is performed on the pseudo wafer that may be obtained at the step illustrated in FIG. 14B with a width narrower than the width between the imaging elements 10A (refer to FIGS. 16 and 17). In the segmented imaging element 10, an insulating layer 52 is arranged as the projection on a bottom surface side of the side surface (refer to FIG. 17B).

By the above-described steps, the imaging element 10 in which the projection including the resin material layer is provided on the side surface may be obtained.

Third Embodiment

A third embodiment also relates to a method of manufacturing an imaging element.

The third embodiment relates to a method of manufacturing an imaging element provided with:

a step of forming a plurality of imaging elements on a semiconductor wafer;

a step of thinning the semiconductor wafer between the imaging elements with a predetermined width from a top surface side of the imaging elements; and a step of segmenting by performing dicing with a width narrower than the predetermined width on the thinned semiconductor wafer.

Then, in the third embodiment, a dicing blade with a predetermined width is used to thin a space between the imaging elements with the predetermined width, and a dicing blade with a narrower width than the predetermined width is used to perform segmentation.

Hereinafter, with reference to FIGS. 18A, 18B, 19, 20A, 20B, 21A and 21B, the method of manufacturing the imaging element according to the third embodiment of the present disclosure is described.

Figure 18A:
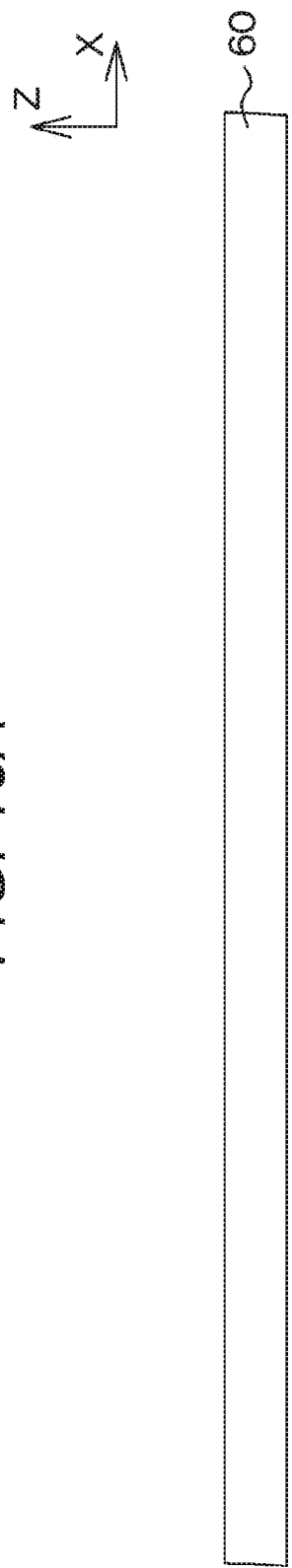
FIGS. 18A and 18B are schematic partial cross-sectional views for explaining a method of manufacturing an imaging element according to a third embodiment of the present disclosure.
Figure 18B:
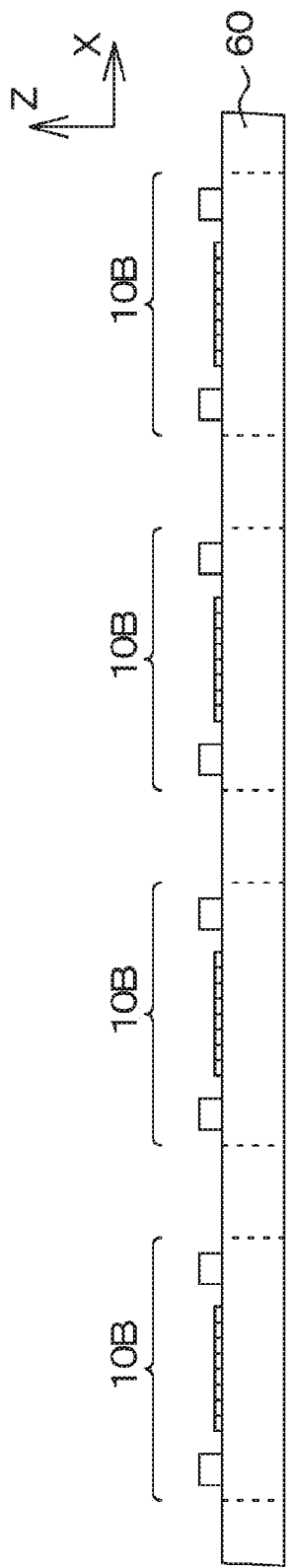
Figure 19:
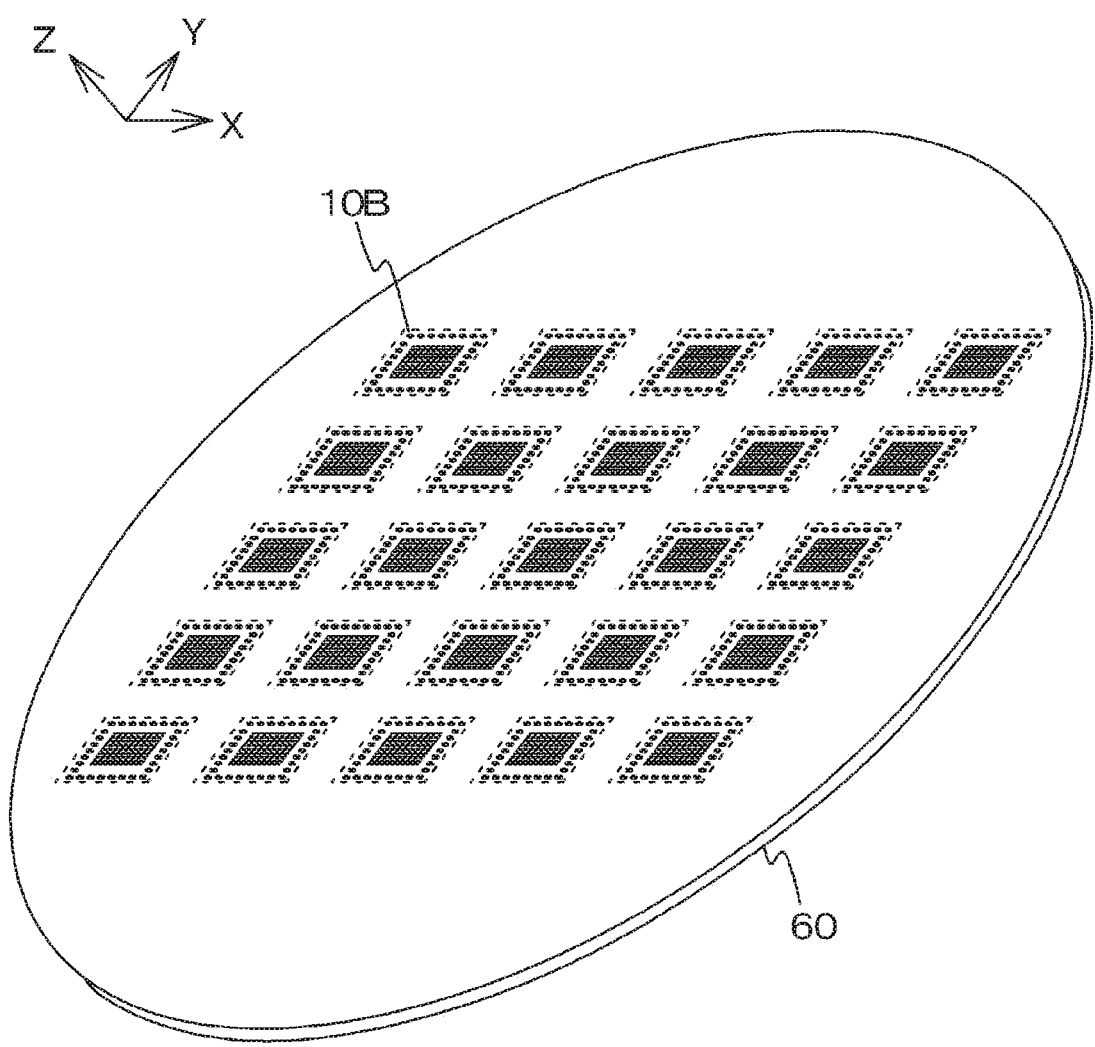
FIG. 19 is a schematic perspective view for explaining a semiconductor wafer that may be obtained at a step illustrated in FIG. 18B.

[Step-300] (refer to FIGS. 18A and 18B and FIG. 19)

A semiconductor wafer 60 is prepared (refer to FIG. 18A), and a plurality of imaging elements is formed on a semiconductor substrate at a predetermined interval (refer to FIG. 18B). A portion corresponding to the imaging element is represented by reference numeral 10B. FIG. 18 is a schematic perspective view for explaining the semiconductor wafer that may be obtained at a step illustrated in FIG. 19.

Figure 20A:
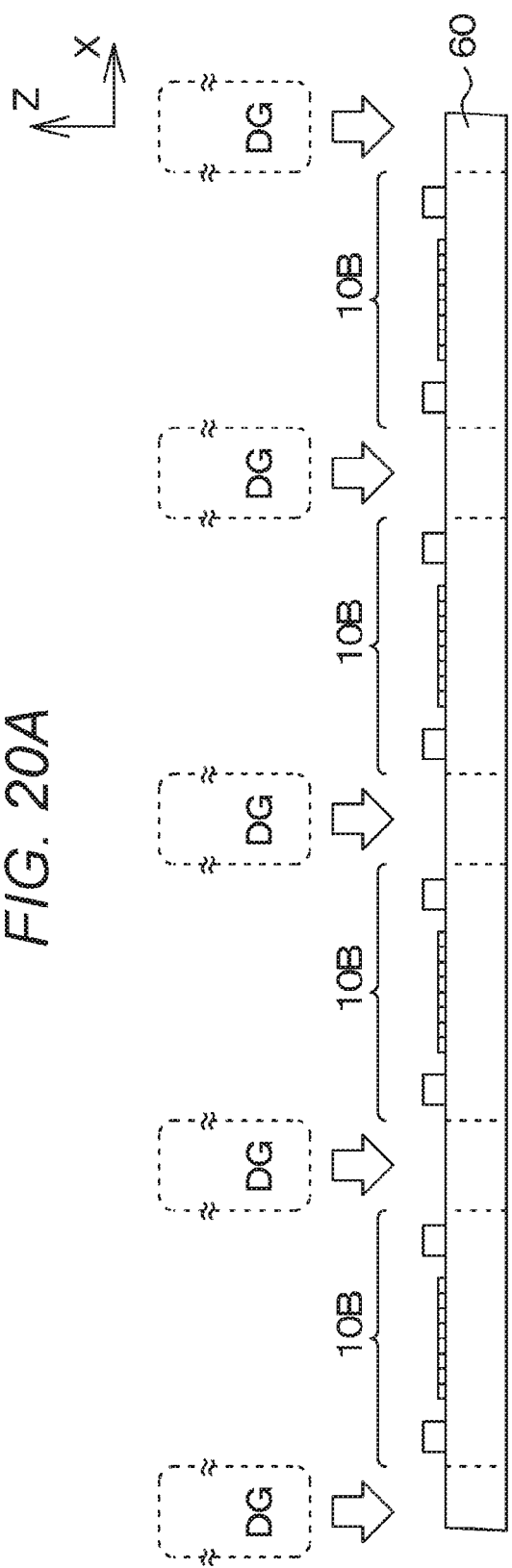
FIGS. 20A and 20B are schematic partial cross-sectional views for explaining the method of manufacturing the imaging element according to the third embodiment of the present disclosure continuous from FIG. 18B.
Figure 20B:
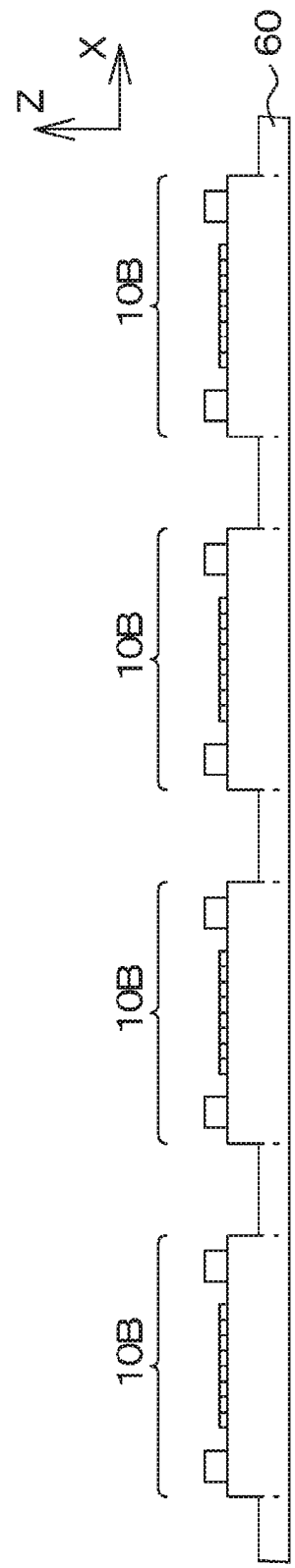

[Step-310] (Refer to FIGS. 20A and 20B)

Next, the semiconductor wafer 60 between the imaging elements 10B is thinned with a predetermined width from a top surface side (photoelectric conversion unit side) of the imaging element 10B formed on the semiconductor wafer

60. More specifically, a space between the imaging elements 10B is thinned with the predetermined width using the dicing blade having the predetermined width (refer to FIGS. 20A and 20B).

[Step-320] (Refer to FIGS. 21A and 21B)

Thereafter, segmentation is performed using the dicing blade having a narrower width than the predetermined width (refer to FIGS. 21A and 21B).

By the above-described steps, the imaging element 10 in which a projection including a part of the semiconductor substrate forming the imaging element is provided on a side surface may be obtained.

Fourth Embodiment

A fourth embodiment also relates to a method of manufacturing an imaging element.

In the third embodiment, the dicing blade with the predetermined width is used to thin the space between the imaging elements with the predetermined width, and the dicing blade with the narrower width than the predetermined width is used to segment. In contrast, in the fourth embodiment, an etching technique is used to thin a space between imaging elements with a predetermined width, and a dicing blade with a narrower width than the predetermined width is used to perform segmentation.

Hereinafter, with reference to FIGS. 22A and 22B, the method of manufacturing the imaging element according to the fourth embodiment of the present disclosure is described.

[Step-400]

A plurality of imaging elements is formed on a semiconductor substrate at a predetermined interval at a step similar to [Step-300] described in the third embodiment (refer to FIG. 18B).

[Step-410] (Refer to FIGS. 22A and 22B)

Next, thinning is performed between the imaging elements with the predetermined width using the etching technique. Specifically, a mask 70 having an opening in a portion to be thinned is formed (refer to FIG. 22A), and then an etching process such as RIE is performed to thin (refer to FIG. 22B).

[Step-420]

Thereafter, segmentation is performed at a step similar to [Step-320] described in the third embodiment.

By the above-described steps, the imaging element 10 in which a projection including a part of the semiconductor substrate forming the imaging element is provided on a side surface may be obtained.

Fifth Embodiment: Application Example

The technology according to the present disclosure is applicable to various products. For example, the technology according to the present disclosure may also be realized as a device mounted on any type of mobile body such as an automobile, an electric automobile, a hybrid electric automobile, a motorcycle, a bicycle, a personal mobility, an airplane, a drone, a ship, a robot, a building machine, or an agricultural machine (tractor).

Figure 23:
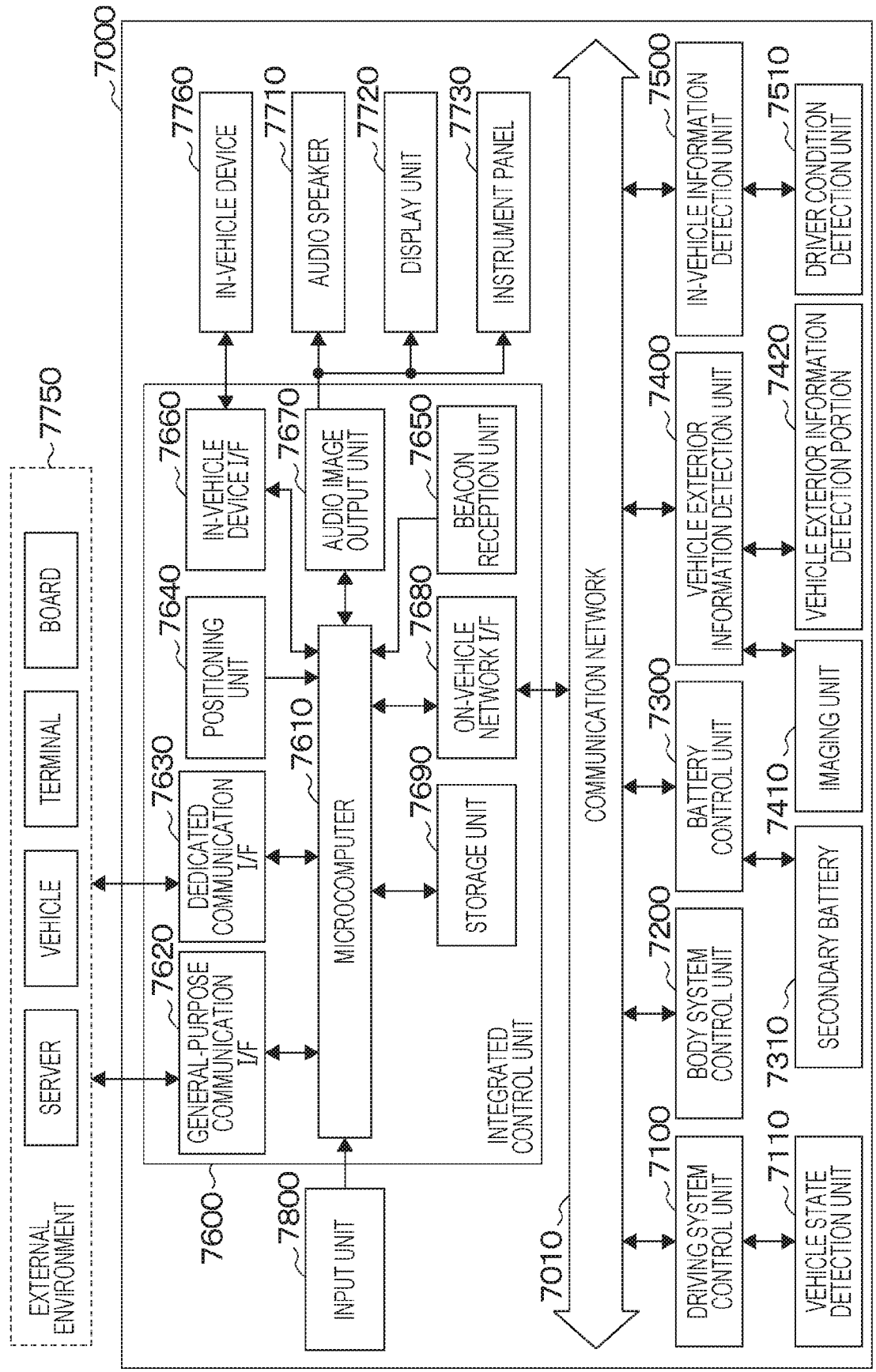
FIG. 23 is a block diagram illustrating an example of a schematic configuration of a vehicle control system.

FIG. 23 is a block diagram illustrating a schematic configuration example of a vehicle control system 7000 that is an example of a mobile body control system to which the technology according to the present disclosure may be applied. The vehicle control system 7000 is provided with a plurality of electronic control units connected to one another via a communication network 7010. In the example illustrated in FIG. 23, the vehicle control system 7000 is provided with a driving system control unit 7100, a body system control unit 7200, a battery control unit 7300, a vehicle exterior information detection unit 7400, an in-vehicle information detection unit 7500, and an integrated control unit 7600. The communication network 7010 that connects a plurality of control units may be, for example, an on-vehicle communication network compliant with any standard such as a controller area network (CAN), a local interconnect network (LIN), a local area network (LAN), or FlexRay (registered trademark).

Each control unit is provided with a microcomputer that performs arithmetic processing according to various programs, a storage unit that stores a program executed by the microcomputer, a parameter used for various arithmetic operations or the like, and a driving circuit that drives various devices to be controlled. Each control unit is provided with a network I/F for communicating with other control units via the communication network 7010, and a communication I/F for communicating by wired communication or wireless communication with devices, sensors or the like inside and outside the vehicle. In FIG. 23, as a functional configuration of the integrated control unit 7600, a microcomputer 7610, a general-purpose communication I/F 7620, a dedicated communication I/F 7630, a positioning unit 7640, a beacon reception unit 7650, an in-vehicle device I/F 7660, an audio image output unit 7670, an on-vehicle network I/F 7680, and a storage unit 7690 are illustrated. Other control units are similarly provided with a microcomputer, a communication I/F, a storage unit and the like.

The driving system control unit 7100 controls operation of devices related to a driving system of the vehicle according to the various programs. For example, the driving system control unit 7100 serves as a control device such as a driving force generating device for generating driving force of the vehicle such as an internal-combustion engine and a driving motor, a driving force transmitting mechanism for transmitting the driving force to a wheel, a steering mechanism for adjusting a rudder angle of the vehicle, and a braking device for generating braking force of the vehicle. The driving system control unit 7100 may also have a function as a control device such as an antilock brake system (ABS) or an electronic stability control (ESC).

A vehicle state detection unit 7110 is connected to the driving system control unit 7100. The vehicle state detection unit 7110 includes, for example, at least one of a gyro sensor unit that detects an angular velocity of axial rotational movement of a vehicle body, an acceleration sensor that detects acceleration of the vehicle, or sensors for detecting an operation amount of an accelerator pedal, an operation amount of a brake pedal, a steering angle of a steering wheel, an engine speed, a wheel rotational speed or the like. The driving system control unit 7100 performs arithmetic processing using a signal input from the vehicle state detection unit 7110 to control an internal-combustion engine, a driving motor, an electric power steering device, a brake device or the like.

The body system control unit 7200 controls operation of various devices mounted on the vehicle body in accordance with the various programs. For example, the body system control unit 7200 serves as a control device of a keyless entry system, a smart key system, a power window device, or various types of lights such as a head light, a backing light, a brake light, a blinker, or a fog light. In this case, radio waves or signals of various switches transmitted from a portable device that substitutes for a key may be input to the body system control unit 7200. The body system control unit 7200 receives the input of the radio waves or signals and controls the door lock device, power window device, lights and the like of the vehicle.

The battery control unit 7300 controls a secondary battery 7310 that is a power supply source of the driving motor according to the various programs. For example, information of battery temperature, battery output voltage, remaining battery capacity or the like is input to the battery control unit 7300 from the battery device provided with the secondary battery 7310. The battery control unit 7300 performs arithmetic processing using these signals, and performs temperature adjustment control of the secondary battery 7310 or control of a cooling device and the like provided on the battery device.

The vehicle exterior information detection unit 7400 detects information outside the vehicle equipped with the vehicle control system 7000. For example, the vehicle exterior information detection unit 7400 is connected to at least one of an imaging unit 7410 or a vehicle exterior information detection portion 7420. The imaging unit 7410 includes at least one of a time of flight (ToF) camera, a stereo camera, a monocular camera, an infrared camera, or other cameras. The vehicle exterior information detection portion 7420 includes, for example, at least one of an environment sensor for detecting current weather or climate, or a peripheral information detection sensor for detecting another vehicle, an obstacle, a pedestrian or the like around the vehicle equipped with the vehicle control system 7000.

The environment sensor may be, for example, at least one of a raindrop sensor that detects rainy weather, a fog sensor that detects fog, a sunshine sensor that detects a sunlight degree, or a snow sensor that detects snowfall. The peripheral information detection sensor may be at least one of an ultrasonic sensor, a radar device, or a light detection and ranging (laser imaging detection and ranging) (LIDAR) device. The imaging unit 7410 and the vehicle exterior information detection portion 7420 may be provided as independent sensors or devices, or may be provided as a device in which a plurality of sensors or devices is integrated.

Figure 24:
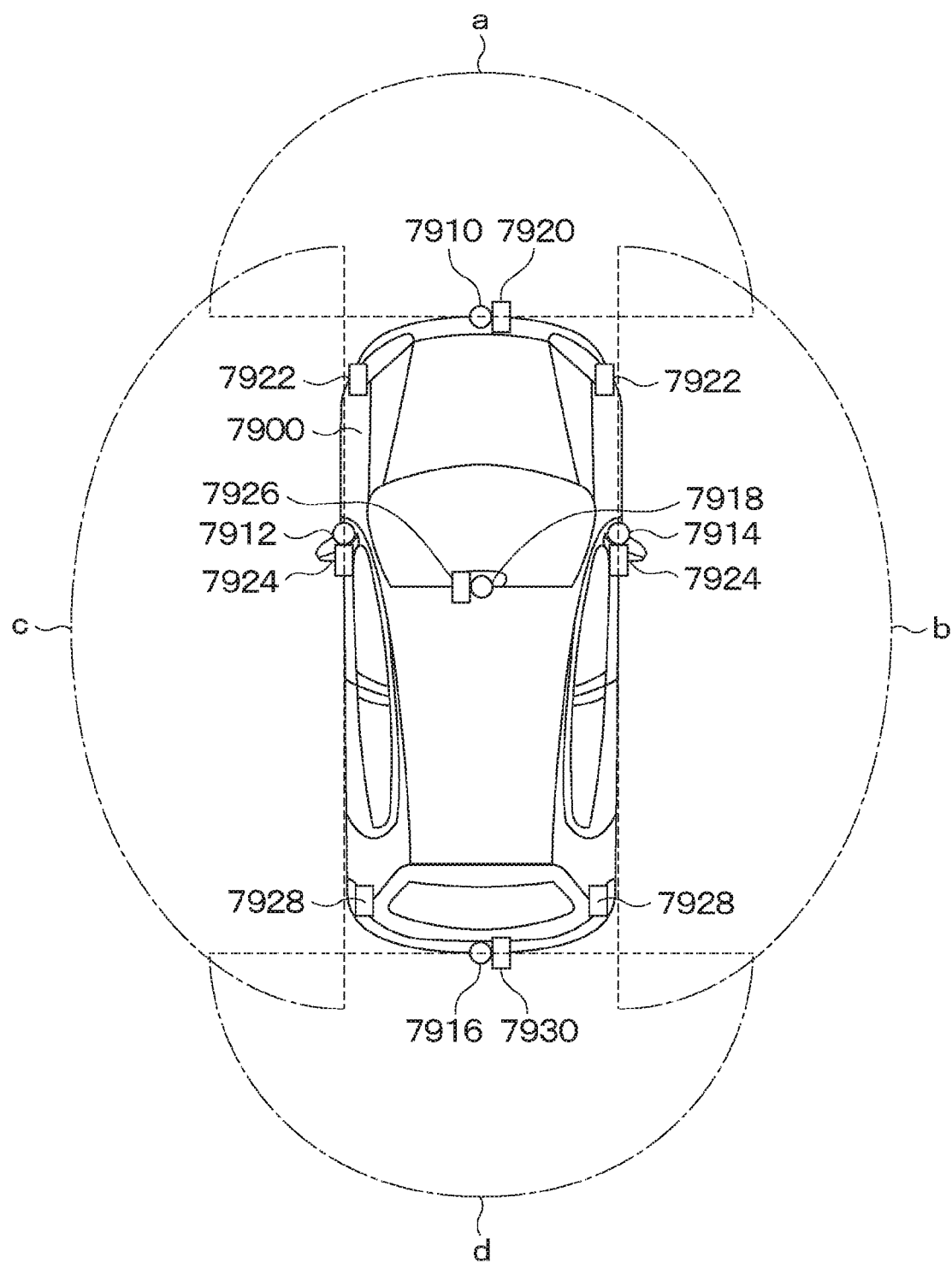
FIG. 24 is an explanatory view illustrating an example of an installation position of a vehicle exterior information detection portion and an imaging unit.

Here, FIG. 24 illustrates an example of an installation position of the imaging unit 7410 and the vehicle exterior information detection portion 7420. Each of imaging units 7910, 7912, 7914, 7916, and 7918 is arranged at least one position of a front nose, a side mirror, a rear bumper, a rear door, and an upper portion of a windshield in a vehicle interior of the vehicle 7900, for example. The imaging unit 7910 provided on the front nose and the imaging unit 7918 provided in the upper portion of the windshield in the vehicle interior principally obtain images in front of the vehicle 7900. The imaging units 7912 and 7914 provided on the side mirrors principally obtain images of the sides of the vehicle 7900. The imaging unit 7916 provided on the rear bumper or the rear door principally obtains an image behind the vehicle 7900. The imaging unit 7918 provided in the upper portion of the windshield in the vehicle interior is principally used for detecting the preceding vehicle, pedestrian, obstacle, traffic signal, traffic sign, lane or the like.

Note that, in FIG. 24, an example of imaging ranges of the imaging units 7910, 7912, 7914, and 7916 is illustrated. An imaging range a indicates the imaging range of the imaging unit 7910 provided on the front nose, imaging ranges b and c indicate the imaging ranges of the imaging units 7912 and 7914 provided on the side mirrors, and an imaging range d indicates the imaging range of the imaging unit 7916 provided on the rear bumper or rear door. For example, image data taken by the imaging units 7910, 7912, 7914, and 7916 are superimposed, and an overhead image of the vehicle 7900 as seen from above is obtained.

Vehicle exterior information detection portions 7920, 7922, 7924, 7926, 7928, and 7930 provided on the front, rear, side, corner, and the upper portion of the windshield of the vehicle interior of the vehicle 7900 may be ultrasonic sensors or radar devices, for example. The vehicle exterior information detection portions 7920, 7926, and 7930 provided on the front nose, rear bumper, rear door, and the upper portion of the windshield in the vehicle interior of the vehicle 7900 may be, for example, LIDAR devices. These vehicle exterior information detection portions 7920 to 7930 are principally used for detecting the preceding vehicle, pedestrian, obstacle or the like.

Returning to FIG. 23, the description is continued. The vehicle exterior information detection unit 7400 allows the imaging unit 7410 to capture an image outside the vehicle and receives captured image data. Furthermore, the vehicle exterior information detection unit 7400 receives detection information from the vehicle exterior information detection portion 7420 connected thereto. In a case where the vehicle exterior information detection portion 7420 is the ultrasonic sensor, radar device, or LIDAR device, the vehicle exterior information detection unit 7400 transmits ultrasonic waves, electromagnetic waves or the like, and receives information of received reflected waves. The vehicle exterior information detection unit 7400 may perform object detection processing of a person, a vehicle, an obstacle, a sign, a character on a road surface or the like or distance detection processing on the basis of the received information. The vehicle exterior information detection unit 7400 may perform an environment recognition processing for recognizing rainfall, fog, a road surface condition or the like on the basis of the received information. The vehicle exterior information detection unit 7400 may calculate a distance to an object outside the vehicle on the basis of the received information.

Furthermore, the vehicle exterior information detection unit 7400 may perform image recognition processing of recognizing the person, vehicle, obstacle, sign, character on the road surface or the like or distance detection processing on the basis of the received image data. The vehicle exterior information detection unit 7400 may perform processing such as distortion correction or position alignment on the received image data, and combine the image data captured by the different imaging units 7410 to generate an overhead image or a panoramic image. The vehicle exterior information detection unit 7400 may perform viewpoint conversion processing using the image data captured by the different imaging units 7410.

The in-vehicle information detection unit 7500 detects information in the vehicle. The in-vehicle information detection unit 7500 is connected to, for example, a driver condition detection unit 7510 that detects a condition of a driver. The driver condition detection unit 7510 may include a camera that images the driver, a biometric sensor that detects biometric information of the driver, a microphone that collects sound in the vehicle interior and the like. The biometric sensor is provided, for example, on a seat surface, a steering wheel or the like and detects biometric information of a passenger who sits on the seat or the driver who holds the steering wheel. The in-vehicle information detection unit 7500 may calculate a driver's fatigue level or concentration level or may determine whether or not the driver is dozing on the basis of detection information input from the driver condition detection unit 7510. The in-vehicle information detection unit 7500 may perform processing such as noise canceling processing on the collected audio signal.

The integrated control unit 7600 controls overall operation in the vehicle control system 7000 according to the various programs. An input unit 7800 is connected to the integrated control unit 7600. The input unit 7800 is realized by a device input operation of which may be performed by the passenger such as a touch panel, a button, a microphone, a switch, or a lever, for example. To the integrated control unit 7600, data obtained by audio recognition of audio input by the microphone may be input. The input unit 7800 may be, for example, a remote control device using infrared rays or other radio waves, or may be an external connection device such as a portable phone or a personal digital assistant (PDA) that supports the operation of the vehicle control system 7000. The input unit 7800 may be, for example, a camera, and in that case, the passenger may input information by gesture. Alternatively, data obtained by detecting motion of a wearable device worn by the passenger may be input. Moreover, the input unit 7800 may include, for example, an input control circuit and the like that generates an input signal on the basis of the information input by the passenger or the like using the above-described input unit 7800 and outputs the same to the integrated control unit 7600. The passenger or the like operates the input unit 7800 to input various data to the vehicle control system 7000 or indicates processing operation.

The storage unit 7690 may include a read only memory (ROM) that stores various programs executed by the microcomputer, and a random access memory (RAM) that stores various parameters, arithmetic results, sensor values or the like. Furthermore, the storage unit 7690 may be realized by a magnetic storage device such as a hard disc drive (HDD), a semiconductor storage device, an optical storage device, a magneto-optical storage device or the like.

The general-purpose communication I/F 7620 is a general-purpose communication I/F that mediates communication with various devices present in an external environment 7750. The general-purpose communication I/F 7620 may be equipped with a cellular communication protocol such as a global system of mobile communications (GSM) (registered trademark), WiMAX (registered trademark), long term evolution (LTE) (registered trademark), or LTE-advanced (LTE-A), or other wireless communication protocol such as wireless LAN (also referred to as Wi-Fi (registered trademark)) and Bluetooth (registered trademark). The general-purpose communication I/F 7620 may be connected to a device (for example, an application server or a control server) present on an external network (for example, the Internet, a cloud network, or an operator-specific network) through, for example, a base station or an access point. Furthermore, the general-purpose communication I/F 7620 may use, for example, a peer to peer (P2P) technology to communicate with a terminal present near the vehicle (for example, a terminal of a driver, a pedestrian, or a store, or a machine type communication (MTC) terminal.

The dedicated communication I/F 7630 is a communication I/F that supports a communication protocol formulated for use in a vehicle. The dedicated communication I/F 7630 may be equipped with a standard protocol such as wireless access in vehicle environment (WAVE) that is a combination of lower-layer IEEE802.11p and upper-layer IEEE1609, dedicated short range communications (DSRC), or the cellular communication protocol, for example. The dedicated communication I/F 7630 typically performs V2X communication that is a concept including one or more of vehicle-to-vehicle communication, vehicle-to-infrastructure communication, vehicle-to-home communication, and vehicle-to-pedestrian communication.

The positioning unit 7640 executes positioning by receiving a GNSS signal from a global navigation satellite system (GNSS) satellite (for example, a GPS signal from a global positioning system (GPS) satellite) for example, and generates position information including latitude, longitude, and altitude of the vehicle. Note that, the positioning unit 7640 may specify a current position by exchanging signals with a wireless access point, or may obtain position information from a terminal such as a portable phone, PHS, or smartphone having a positioning function.

For example, the beacon reception unit 7650 receives radio waves or electromagnetic waves transmitted from a wireless station and the like installed on the road, and obtains information such as the current position, traffic jam, closed road, required time or the like. Note that, the function of the beacon reception unit 7650 may be included in the dedicated communication I/F 7630 described above.

The in-vehicle device I/F 7660 is a communication interface that mediates connection between the microcomputer 7610 and various in-vehicle devices 7760 present in the vehicle. The in-vehicle device I/F 7660 may establish wireless connection using the wireless communication protocol such as wireless LAN, Bluetooth (registered trademark), near field communication (NFC), or wireless USB (WUSB). Furthermore, the in-vehicle device I/F 7660 may establish wired connection such as universal serial bus (USB), high-definition multimedia interface (HDMI) (registered trademark), or mobile high-definition link (MHL) through a connection terminal (and a cable if necessary) not illustrated. The in-vehicle device 7760 may include, for example, at least one of a mobile device or a wearable device that the passenger has, or an information device that is carried in or attached to the vehicle. Furthermore, the in-vehicle device 7760 may include a navigation device that searches for a route to an arbitrary destination. The in-vehicle device I/F 7660 exchanges control signals or data signals with these in-vehicle devices 7760.

The on-vehicle network I/F 7680 is an interface that mediates communication between the microcomputer 7610 and the communication network 7010. The on-vehicle network I/F 7680 transmits and receives signals and the like in accordance with a predetermined protocol supported by the communication network 7010.

The microcomputer 7610 of the integrated control unit 7600 controls the vehicle control system 7000 according to the various programs on the basis of the information obtained by means of at least one of the general-purpose communication I/F 7620, the dedicated communication I/F 7630, the positioning unit 7640, the beacon reception unit 7650, the in-vehicle device I/F 7660, or the on-vehicle network I/F 7680. For example, the microcomputer 7610 may perform arithmetic operation of a control target value of the driving force generating device, steering mechanism, or braking device on the basis of the obtained information inside and outside the vehicle and output a control command to the driving system control unit 7100. For example, the microcomputer 7610 may perform cooperative control for realizing functions of advanced driver assistance system (ADAS) including collision avoidance or impact attenuation of the vehicle, following travel based on the distance between the vehicles, vehicle speed maintaining travel, vehicle collision warning, vehicle lane departure warning or the like. Furthermore, the microcomputer 7610 may perform the cooperative control for realizing automatic driving and the like to autonomously travel independent from the operation of the driver by controlling the driving force generating device, the steering mechanism, the braking device or the like on the basis of the obtained information around the vehicle.

The microcomputer 7610 may generate three-dimensional distance information between the vehicle and an object such as a peripheral structure or a person on the basis of the information obtained by means of at least one of the general-purpose communication I/F 7620, dedicated communication I/F 7630, positioning unit 7640, beacon reception unit 7650, in-vehicle device I/F 7660, or on-vehicle network I/F 7680 and create local map information including peripheral information of the vehicle current position. Furthermore, the microcomputer 7610 may generate a warning signal by predicting a danger such as a vehicle collision, approach of a pedestrian or the like, entry to a closed road or the like on the basis of the obtained information. The warning signal may be, for example, a signal for generating a warning sound or lighting a warning lamp.

The audio image output unit 7670 transmits at least one of audio or image output signals to an output device capable of visually or aurally notifying the passenger of the vehicle or the outside the vehicle of the information. In the example in FIG. 23, as the output device, an audio speaker 7710, a display unit 7720, and an instrument panel 7730 are illustrated. The display unit 7720 may include at least one of an on-board display or a head-up display, for example. The display unit 7720 may have an augmented reality (AR) display function. The output device may also be other devices such as a headphone, a wearable device such as eyeglass-type display worn by the passenger, a projector, or a lamp in addition to these devices. In a case where the output device is a display device, the display device visually displays the results obtained by various types of processing performed by the microcomputer 7610 or the information received from other control units in various formats such as text, image, table, and graph. Furthermore, in a case where the output device is an audio output device, the audio output device converts an audio signal including reproduced audio data, acoustic data or the like into an analog signal and aurally outputs the same.

Note that, in the example illustrated in FIG. 23, at least two control units connected through the communication network 7010 may be integrated as one control unit. Alternatively, each control unit may be configured by a plurality of control units. Moreover, the vehicle control system 7000 may be provided with another control unit not illustrated. Furthermore, in the above description, some or all of the functions of any of the control units may be provided to other control units. That is, as long as the information is transmitted and received through the communication network 7010, predetermined arithmetic processing may be performed by any one of the control units. Similarly, a sensor or a device connected to any one of the control units may be connected to another control unit, and a plurality of control units may transmit/receive detection information to/from each other through the communication network 7010.

The technology according to the present disclosure is applicable to, for example, the imaging unit of the vehicle exterior information detection unit out of the configurations described above.

[Others]

Although the embodiments of the present disclosure are heretofore described specifically, the present disclosure is not limited to the above-described embodiments, and various modifications based on the technical idea of the present disclosure may be made. For example, numerical values, structures, substrates, materials, processes and the like mentioned in the above-described embodiments are merely examples, and numerical values, structures, substrates, materials, processes and the like different from those may also be used as needed.

Note that, the technology of the present disclosure may also have the following configuration.

[A1]

An imaging element that is flip-chip mounted on a wiring substrate, in which a projection is provided on a side surface of the imaging element such that a bottom surface side of the imaging element projects from a top surface side.

[A2]

The imaging element according to [A1] described above, in which a photoelectric conversion unit is provided on a top surface of the imaging element.

[A3]

The imaging element according to [A1] or [A2] described above, in which the projection includes a part of a semiconductor substrate that forms the imaging element.

[A4]

The imaging element according to [A1] or [A2] described above, in which the projection includes a material different from a material of a semiconductor substrate that forms the imaging element.

[A5]

The imaging element according to [A4] described above, in which the projection includes a resin material.

[A6]

The imaging element according to [A5] described above, in which the resin material includes a thermosetting resin material.

[A7]

The imaging element according to any one of [A1] to [A6] described above, in which a thickness of the projection is half a thickness of the semiconductor substrate that forms the imaging element or smaller.

[A8]

The imaging element according to any one of [A1] to [A7] described above, in which a projecting width of the projection is one-quarter of the thickness of the semiconductor substrate that forms the imaging element or smaller.

[B1]

An imaging device including:

a wiring substrate; and an imaging element, in which a projection is provided on a side surface of the imaging element such that a bottom surface side of the imaging element projects from a top surface side, the imaging element is flip-chip mounted on the wiring substrate such that a top surface faces the wiring substrate, and an outer periphery of the imaging element on the wiring substrate is sealed with a sealing material.

[B2]

The imaging device according to [B1] described above, in which a photoelectric conversion unit is provided on the top surface of the imaging element.

[B3]

The imaging device according to [B1] or [B2] described above,
in which a light receiving window is provided in a portion of the wiring substrate facing the photoelectric conversion unit.

[B4]
The imaging device according to any one of [B1] to [B3] described above,
in which the projection includes a part of a semiconductor substrate that forms the imaging element.

[B5]
The imaging device according to any one of [B1] to [B4] described above,
in which the projection includes a material different from a material of the semiconductor substrate that forms the imaging element.

[B6]
The imaging device according to [B5] described above,
in which the projection includes a resin material.

[B7]
The imaging device according to [B6] described above,
in which the resin material includes a thermosetting resin material.

[B8]
The imaging device according to any one of [B1] to [B7] described above,
in which a thickness of the projection is half a thickness of the semiconductor substrate that forms the imaging element or smaller.

[B9]
The imaging device according to any one of [B1] to [B8] described above,
in which a projecting width of the projection is one-quarter of the thickness of the semiconductor substrate that forms the imaging element or smaller.

[C1]
A method of manufacturing an imaging element, including:
a step of forming a pseudo wafer in a state in which bottom surfaces of imaging elements are arranged on a same surface and a resin material layer thinner than the imaging element is arranged between the imaging elements; and
a step of segmenting by performing dicing on the pseudo wafer with a width narrower than a width between the imaging elements.

[C2]
The method of manufacturing the imaging element according to [C1] described above,
in which the resin material layer includes a thermosetting resin material.

[D1]
A method of manufacturing an imaging element, including:
a step of forming a plurality of imaging elements on a semiconductor wafer;
a step of thinning the semiconductor wafer between the imaging elements with a predetermined width from a top surface side of the imaging elements; and
a step of segmenting by performing dicing with a width narrower than the predetermined width on a thinned portion of the semiconductor wafer.

[D2]
The method of manufacturing the imaging element according to [D1] described above, including:
thinning a space between the imaging elements with a predetermined width by using a dicing blade with the predetermined width; and
segmenting by using a dicing blade with a narrower width than the predetermined width.

[D3]
The method of manufacturing the imaging element according to [D1] described above, including:
thinning a space between the imaging elements with a predetermined width by using an etching technique; and
segmenting by using a dicing blade with a narrower width than the predetermined width.

[E1]
An electronic device including:
an imaging device obtained by flip-chip mounting an imaging element on a wiring substrate,
in which a projection is provided on a side surface of the imaging element such that a bottom surface side of the imaging element projects from a top surface side,
the imaging element is flip-chip mounted on the wiring substrate such that a top surface faces the wiring substrate, and
an outer periphery of the imaging element on the wiring substrate is sealed with a sealing material.

[E2]
The electronic device according to [E1] described above,
in which a photoelectric conversion unit is provided on a top surface of the imaging element.

[E3]
The electronic device according to [E1] or [E2] described above,
in which a light receiving window is provided in a portion of the wiring substrate facing the photoelectric conversion unit.

[E4]
The electronic device according to any one of [E1] to [E3] described above,
in which the projection includes a part of a semiconductor substrate that forms the imaging element.

[E5]
The electronic device according to any one of [E1] to [E4] described above,
in which the projection includes a material different from a material of the semiconductor substrate that forms the imaging element.

[E6]
The electronic device according to [E5] described above,
in which the projection includes a resin material.

[E7]
The electronic device according to [E6] described above,
in which the resin material includes a thermosetting resin material.

[E8]
The electronic device according to any one of [E1] to [E7] described above,
in which a thickness of the projection is half a thickness of the semiconductor substrate that forms the imaging element or smaller.

[E9]
The electronic device according to any one of [E1] to [E8] described above,
in which a projecting width of the projection is one-quarter of the thickness of the semiconductor substrate that forms the imaging element or smaller.

REFERENCE SIGNS LIST

10, 10A, 90 Imaging element
10B Forming region of imaging element
11 Bottom surface of imaging element 12, 92 Side surface of imaging element
12A Side surface on bottom surface side (projection)
12B Side surface on top surface side
13 Top surface of imaging element
14 Photoelectric conversion unit
14 Electrode of imaging element (solder bump)
20 Wiring substrate
21 Light receiving window
22 Electrode of wiring substrate
30 Sealing material
40 Support substrate
41 Adhesive layer (peeling layer)
50 Support substrate
51 Adhesive layer (peeling layer)
52 Resin material layer
60 Semiconductor wafer (semiconductor substrate)
70 Mask
100, 900 Imaging device
DG Dicing blade

The invention claimed is:

1. An imaging element, comprising:
a projection;
a side surface;
a top surface side; and
a bottom surface side, wherein
the imaging element is flip-chip mounted on a wiring substrate,
the projection is on the side surface of the imaging element such that the bottom surface side projects from the top surface side,
an outer periphery of the imaging element is sealed with a liquid sealing material between the projection of the imaging element and the wiring substrate,
the sealing material is not penetrated into a gap between the top surface side of the imaging element and the wiring substrate, and
the projection includes a thermosetting resin material.

2. The imaging element according to claim 1, wherein the imaging element includes a photoelectric conversion unit on a top surface of the imaging element.

3. The imaging element according to claim 1, wherein the projection includes a part of a semiconductor substrate that forms the imaging element.

4. The imaging element according to claim 1, wherein the projection includes a material different from a material of a semiconductor substrate that forms the imaging element.

5. The imaging element according to claim 1, wherein a thickness of the projection is half a thickness of a semiconductor substrate that forms the imaging element or smaller.

6. The imaging element according to claim 1, wherein a projecting width of the projection is one-quarter of a thickness of a semiconductor substrate that forms the imaging element or smaller.

7. An imaging device, comprising:
a wiring substrate; and
an imaging element, wherein
the imaging element includes;
a projection,
a side surface,
a bottom surface side, and
a top surface side, wherein
the projection is on the side surface of the imaging element such that the bottom surface side projects from the top surface side,
the projection includes a thermosetting resin material,
the imaging element is flip-chip mounted on the wiring substrate such that a top surface of the imaging element faces the wiring substrate,
an outer periphery of the imaging element on the wiring substrate is sealed with a liquid sealing material between the projection of the imaging element and the wiring substrate, and
the sealing material is not penetrated into a gap between the top surface side of the imaging element and the wiring substrate.

8. The imaging device according to claim 7, wherein the imaging element further includes a photoelectric conversion unit on the top surface of the imaging element.

9. The imaging device according to claim 8, wherein a light receiving window is in a portion of the wiring substrate facing the photoelectric conversion unit.

10. An electronic device, comprising:
an imaging device obtained by flip-chip mounting an imaging element on a wiring substrate, wherein
the imaging element includes:
a projection,
a side surface,
a bottom surface side, and
a top surface side, wherein
the projection is on the side surface of the imaging element such that the bottom surface side projects from the top surface side,
the projection includes a thermosetting resin material,
the imaging element is flip-chip mounted on the wiring substrate such that a top surface of the imaging element faces the wiring substrate,
an outer periphery of the imaging element on the wiring substrate is sealed with a liquid sealing material between the projection of the imaging element and the wiring substrate, and
the sealing material is not penetrated into a gap between the top surface side of the imaging element and the wiring substrate.

* * * * *